US010334735B2

(12) United States Patent
Holec et al.

(10) Patent No.: US 10,334,735 B2
(45) Date of Patent: Jun. 25, 2019

(54) LED LIGHTING SYSTEMS AND METHODS

(75) Inventors: Henry V. Holec, Mendota Heights, MN (US); Wm. Todd Crandell, Minnetonka, MN (US)

(73) Assignee: Metrospec Technology, L.L.C., Mendota Heights, MN (US)

( * ) Notice: Subject to any disclaimer, the term of this patent is extended or adjusted under 35 U.S.C. 154(b) by 0 days.

(21) Appl. No.: 13/592,090

(22) Filed: Aug. 22, 2012

(65) Prior Publication Data
US 2013/0128582 A1 May 23, 2013

Related U.S. Application Data

(63) Continuation-in-part of application No. 13/158,149, filed on Jun. 10, 2011, now Pat. No. 8,851,356, which
(Continued)

(51) Int. Cl.
H05K 1/18 (2006.01)

(52) U.S. Cl.
CPC ... *H05K 1/189* (2013.01); *H05K 2201/09063* (2013.01); *H05K 2201/10106* (2013.01); *Y10T 29/49124* (2015.01)

(58) Field of Classification Search
CPC ..... H01L 23/467; H01L 33/648; H05K 1/189; H05K 2201/09063; H05K 2201/10106; Y10T 29/49124
(Continued)

(56) References Cited

U.S. PATENT DOCUMENTS 2,697,811 A 12/1954 Deming
2,731,609 A 1/1956 Sobell, III
(Continued)

FOREIGN PATENT DOCUMENTS

CN 201242082 5/2009
CN 201731316 2/2011
(Continued)

OTHER PUBLICATIONS

"Final Office Action", for U.S. Appl. No. 13/158,149, dated Mar. 6, 2013 (11 pages).
(Continued)

Primary Examiner — Timor Karimy
(74) Attorney, Agent, or Firm — Pauly, DeVries Smith & Deffner LLC

(57) ABSTRACT

Embodiments of the invention include LED lighting systems and methods. For example, in some embodiments, an LED lighting system is included. The LED lighting system can include a flexible layered circuit structure that can include a top thermally conductive layer, a middle electrically insulating layer, a bottom thermally conductive layer, and a plurality of light emitting diodes mounted on the top layer. The LED lighting system can further include a housing substrate and a mounting structure. The mounting structure can be configured to suspend the layered circuit structure above the housing substrate with an air gap disposed in between the bottom thermally conductive layer of the flexible layered circuit structure and the housing substrate. The distance between the layered circuit structure and the support layer can be at least about 0.5 mm. Other embodiments are also included herein.

28 Claims, 20 Drawing Sheets

Related U.S. Application Data is a continuation-in-part of application No. 12/372,499, filed on Feb. 17, 2009, now Pat. No. 7,980,863, application No. 13/592,090, which is a continuation-in-part of application No. 13/190,639, filed on Jul. 26, 2011, now Pat. No. 8,500,456, which is a continuation of application No. 12/406,761, filed on Mar. 18, 2009, now Pat. No. 8,007,286, application No. 13/592,090, which is a continuation-in-part of application No. 13/411,322, filed on Mar. 2, 2012, now Pat. No. 8,525,193, which is a continuation of application No. 12/043,424, filed on Mar. 6, 2008, now Pat. No. 8,143,631.

(60) Provisional application No. 61/028,779, filed on Feb. 14, 2008, provisional application No. 61/037,595, filed on Mar. 18, 2008, provisional application No. 61/043,006, filed on Apr. 7, 2008.

(58) Field of Classification Search
USPC .... 257/82, 99, 721, 724, E33.075, E23.099; 438/28
See application file for complete search history.

(56) References Cited

U.S. PATENT DOCUMENTS

| | | |
|---|---|---|
| 3,028,573 A | 4/1962 | Stoehr |
| 3,086,189 A | 4/1963 | Robbins |
| 3,270,251 A | 8/1966 | Evans |
| 3,401,369 A | 9/1968 | Plamateer |
| 3,499,098 A | 3/1970 | Mcgahey et al. |
| 3,585,403 A | 6/1971 | Gribbons |
| 3,628,999 A | 12/1971 | Schneble, Jr. et al. |
| 3,640,519 A | 2/1972 | William et al. |
| 3,745,091 A | 7/1973 | Mccormick |
| 4,017,847 A | 4/1977 | Burford et al. |
| 4,150,421 A | 4/1979 | Nishihara et al. |
| 4,173,035 A | 10/1979 | Hoyt |
| 4,249,303 A | 2/1981 | Greenwood et al. |
| 4,250,536 A | 2/1981 | Barringer et al. |
| 4,285,780 A | 8/1981 | Schachter |
| 4,388,136 A | 6/1983 | Jacobus et al. |
| 4,515,304 A | 5/1985 | Berger |
| 4,521,969 A | 6/1985 | Greenwood |
| 4,526,432 A | 7/1985 | Cronin et al. |
| 4,533,188 A | 8/1985 | Miniet |
| 4,618,194 A | 10/1986 | Kwilos |
| 4,685,210 A | 8/1987 | King et al. |
| 4,761,881 A | 8/1988 | Bora et al. |
| 4,795,079 A | 1/1989 | Yamada |
| 4,815,981 A | 3/1989 | Mizuno |
| 4,842,184 A | 6/1989 | Miller, Jr. |
| 4,871,315 A | 10/1989 | Noschese |
| 4,950,527 A | 8/1990 | Yamada |
| 4,991,290 A | 2/1991 | MacKay |
| 5,001,605 A | 3/1991 | Savagian et al. |
| 5,041,003 A | 8/1991 | Smith et al. |
| 5,093,985 A | 3/1992 | Houldsworth et al. |
| 5,103,382 A | 4/1992 | Kondo et al. |
| 5,155,904 A | 10/1992 | Majd |
| 5,176,255 A | 1/1993 | Seidler |
| 5,224,023 A | 6/1993 | Smith et al. |
| 5,254,910 A | 10/1993 | Yang |
| 5,375,044 A | 12/1994 | Guritz |
| 5,404,044 A | 4/1995 | Booth et al. |
| 5,440,454 A | 8/1995 | Hashimoto et al. |
| 5,478,008 A | 12/1995 | Takahashi |
| 5,511,719 A | 4/1996 | Miyake et al. |
| 5,563,777 A | 10/1996 | Miki et al. |
| 5,575,554 A | 11/1996 | Guritz |
| 5,585,675 A | 12/1996 | Knopf |
| 5,887,158 A | 3/1999 | Sample et al. |
| 5,917,149 A | 6/1999 | Barcley et al. |
| 5,920,465 A | 7/1999 | Tanaka |
| 5,984,691 A | 11/1999 | Brodsky et al. |
| 6,040,624 A | 3/2000 | Chambers et al. |
| 6,065,666 A | 5/2000 | Backlund |
| 6,089,442 A | 7/2000 | Ouchi et al. |
| 6,095,405 A | 8/2000 | Kim et al. |
| 6,100,475 A | 8/2000 | Degani et al. |
| 6,113,248 A | 9/2000 | Mistopoulos et al. |
| 6,130,823 A | 10/2000 | Lauder et al. |
| 6,137,816 A | 10/2000 | Kinbara |
| 6,199,273 B1 | 3/2001 | Kubo et al. |
| 6,226,862 B1 | 5/2001 | Neuman |
| 6,239,716 B1 | 5/2001 | Pross et al. |
| 6,299,337 B1 | 10/2001 | Bachl et al. |
| 6,299,469 B1 | 10/2001 | Glovatsky et al. |
| 6,310,445 B1 | 10/2001 | Kashaninejad |
| 6,372,997 B1 | 4/2002 | Hill et al. |
| 6,384,339 B1 | 5/2002 | Neuman |
| 6,428,189 B1 | 8/2002 | Hochstein |
| 6,429,383 B1 | 8/2002 | Sprietsma et al. |
| 6,448,661 B1 | 9/2002 | Kim et al. |
| 6,449,836 B1 | 9/2002 | Miyake et al. |
| 6,465,084 B1 | 10/2002 | Curcio et al. |
| 6,481,874 B2 | 11/2002 | Petroski |
| 6,517,218 B2 | 2/2003 | Hochstein |
| 6,555,756 B2 | 4/2003 | Nakamura et al. |
| 6,578,986 B2 | 6/2003 | Swaris et al. |
| 6,580,228 B1 | 6/2003 | Chen et al. |
| 6,589,594 B1 | 7/2003 | Hembree |
| 6,601,292 B2 | 8/2003 | Li et al. |
| 6,651,322 B1 | 11/2003 | Currie |
| 6,657,297 B1 | 12/2003 | Jewram et al. |
| 6,729,888 B2 | 5/2004 | Imaeda |
| 6,746,885 B2 | 6/2004 | Cao |
| 6,784,027 B2 | 8/2004 | Streubel |
| 6,833,526 B2 | 12/2004 | Sinkunas et al. |
| 6,846,094 B2 | 1/2005 | Luk |
| 6,851,831 B2 | 2/2005 | Karlicek, Jr. et al. |
| 6,884,313 B2 | 4/2005 | Liu et al. |
| 6,897,622 B2 | 5/2005 | Lister |
| 6,898,084 B2 | 5/2005 | Misra |
| 6,902,099 B2 | 6/2005 | Motonishi et al. |
| 6,919,529 B2 | 7/2005 | Franzen et al. |
| 6,936,855 B1 | 8/2005 | Harrah |
| 6,963,175 B2 | 11/2005 | Archenhold et al. |
| 6,966,674 B2 | 11/2005 | Tsai |
| 6,991,473 B1 | 1/2006 | Balcome et al. |
| 6,996,674 B2 | 2/2006 | Chiu et al. |
| 7,023,147 B2 | 4/2006 | Colby et al. |
| 7,037,114 B1 | 5/2006 | Eiger et al. |
| 7,086,756 B2 | 8/2006 | Maxik |
| 7,086,767 B2 | 8/2006 | Sidwell et al. |
| 7,114,831 B2 | 10/2006 | Popovich et al. |
| 7,114,837 B2 | 10/2006 | Yagi et al. |
| 7,149,097 B1 | 12/2006 | Shteynberg et al. |
| 7,199,309 B2 | 4/2007 | Chamberlin et al. |
| 7,204,615 B2 | 4/2007 | Arik et al. |
| 7,210,818 B2 | 5/2007 | Luk et al. |
| 7,248,245 B2 | 7/2007 | Adachi et al. |
| 7,253,449 B2 | 8/2007 | Wu |
| 7,256,554 B2 | 8/2007 | Lys |
| 7,262,438 B2 | 8/2007 | Mok et al. |
| 7,263,769 B2 | 9/2007 | Morimoto et al. |
| 7,276,861 B1 | 10/2007 | Shteynberg et al. |
| 7,284,882 B2 | 10/2007 | Burkholder |
| 7,325,955 B2 | 2/2008 | Lucas et al. |
| 7,331,796 B2 | 2/2008 | Hougham et al. |
| 7,341,476 B2 | 3/2008 | Soeta |
| 7,344,279 B2 | 3/2008 | Mueller et al. |
| 7,377,669 B2 | 5/2008 | Farmer et al. |
| 7,377,787 B1 | 5/2008 | Eriksson |
| 7,394,027 B2 | 7/2008 | Kaluzni et al. |
| 7,397,068 B2 | 7/2008 | Park et al. |
| 7,448,923 B2 | 11/2008 | Uka |
| 7,459,864 B2 | 12/2008 | Lys |
| 7,497,695 B2 | 3/2009 | Uchida et al. |
| 7,502,846 B2 | 3/2009 | McCall |
| 7,514,880 B2 | 4/2009 | Huang et al. |
| 7,543,961 B2 | 6/2009 | Arik et al. |

(56) References Cited

U.S. PATENT DOCUMENTS

| | | |
|---|---|---|
| 7,547,124 B2 | 6/2009 | Chang et al. |
| 7,550,930 B2 | 6/2009 | Cristoni et al. |
| 7,553,051 B2 | 6/2009 | Brass et al. |
| 7,556,405 B2 | 7/2009 | Kingsford et al. |
| 7,556,406 B2 | 7/2009 | Petroski et al. |
| 7,573,210 B2 | 8/2009 | Ashdown et al. |
| 7,583,035 B2 | 9/2009 | Shteynberg et al. |
| 7,598,685 B1 | 10/2009 | Shteynberg et al. |
| 7,656,103 B2 | 2/2010 | Shteynberg et al. |
| 7,665,999 B2 | 2/2010 | Hougham et al. |
| 7,696,628 B2 | 4/2010 | Ikeuchi et al. |
| 7,710,047 B2 | 5/2010 | Shteynberg et al. |
| 7,710,050 B2 | 5/2010 | Preston et al. |
| 7,777,236 B2 | 8/2010 | Pachler |
| 7,800,315 B2 | 9/2010 | Shteynberg et al. |
| 7,806,572 B2 | 10/2010 | Mcfadden et al. |
| 7,810,955 B2 | 10/2010 | Stimac et al. |
| 7,852,009 B2 | 12/2010 | Coleman et al. |
| 7,852,300 B2 | 12/2010 | Shteynberg et al. |
| 7,880,400 B2 | 2/2011 | Zhou et al. |
| 7,888,881 B2 | 2/2011 | Shteynberg et al. |
| 7,902,769 B2 | 3/2011 | Shteynberg et al. |
| 7,902,771 B2 | 3/2011 | Shteynberg et al. |
| 7,943,940 B2 | 5/2011 | Boonekamp et al. |
| 7,952,294 B2 | 5/2011 | Shteynberg et al. |
| 7,956,554 B2 | 6/2011 | Shteynberg et al. |
| 7,977,698 B2 | 7/2011 | Ling et al. |
| 7,980,863 B1 | 7/2011 | Holec et al. |
| 8,004,211 B2 | 8/2011 | Van Erp |
| 8,007,286 B1 | 8/2011 | Holec et al. |
| 8,011,806 B2 | 9/2011 | Shiraishi et al. |
| 8,038,329 B2 | 10/2011 | Takahasi et al. |
| 8,045,312 B2 | 10/2011 | Shrier |
| 8,061,886 B1 | 11/2011 | Kraus, Jr. et al. |
| 8,065,794 B2 | 11/2011 | En et al. |
| 8,067,896 B2 | 11/2011 | Shteynberg et al. |
| 8,075,477 B2 | 12/2011 | Nakamura et al. |
| 8,115,370 B2 | 2/2012 | Huang |
| 8,124,429 B2 | 2/2012 | Norman |
| 8,137,113 B2 | 3/2012 | Ouchi et al. |
| 8,143,631 B2 | 3/2012 | Crandell et al. |
| 8,162,200 B2 | 4/2012 | Buchwalter et al. |
| 8,166,650 B2 | 5/2012 | Thomas |
| 8,210,422 B2 | 7/2012 | Zadesky |
| 8,210,424 B2 | 7/2012 | Weibezahn |
| 8,227,962 B1 | 7/2012 | Su |
| 8,232,735 B2 | 7/2012 | Shteynberg et al. |
| 8,242,704 B2 | 8/2012 | Lethellier |
| 8,253,349 B2 | 8/2012 | Shteynberg et al. |
| 8,253,666 B2 | 8/2012 | Shteynberg et al. |
| 8,264,169 B2 | 9/2012 | Shteynberg et al. |
| 8,264,448 B2 | 9/2012 | Shteynberg et al. |
| 8,410,720 B2 | 4/2013 | Holec et al. |
| 8,500,456 B1 | 8/2013 | Holec et al. |
| 8,525,193 B2 | 9/2013 | Crandell et al. |
| 8,618,669 B2 | 12/2013 | Furuta |
| 8,710,764 B2 | 4/2014 | Holec et al. |
| 8,851,356 B1 | 10/2014 | Holec et al. |
| 8,947,389 B1 | 2/2015 | Shin et al. |
| 8,968,006 B1 | 3/2015 | Holec et al. |
| 9,341,355 B2 | 5/2016 | Crandell et al. |
| 9,357,639 B2 | 5/2016 | Holec et al. |
| 9,474,154 B2 | 10/2016 | Johansson et al. |
| 9,736,946 B2 | 8/2017 | Holec et al. |
| 2001/0000906 A1 | 5/2001 | Yoshikawa et al. |
| 2001/0004085 A1 | 6/2001 | Gueissaz |
| 2002/0014518 A1 | 2/2002 | Totani et al. |
| 2002/0043402 A1* | 4/2002 | Juskey et al. .......... 174/260 |
| 2002/0094705 A1 | 7/2002 | Driscoll et al. |
| 2002/0105373 A1 | 8/2002 | Sudo |
| 2002/0148636 A1 | 10/2002 | Belke et al. |
| 2002/0179331 A1 | 12/2002 | Brodsky et al. |
| 2003/0040166 A1 | 2/2003 | Moshayedi |
| 2003/0052594 A1* | 3/2003 | Matsui et al. .......... 313/495 |
| 2003/0072153 A1 | 4/2003 | Matsui et al. |
| 2003/0079341 A1 | 5/2003 | Miyake et al. |
| 2003/0092293 A1 | 5/2003 | Ohtsuki et al. |
| 2003/0094305 A1 | 5/2003 | Ueda |
| 2003/0098339 A1 | 5/2003 | Totani et al. |
| 2003/0137839 A1 | 7/2003 | Lin |
| 2003/0146018 A1 | 8/2003 | Sinkunas et al. |
| 2003/0193789 A1 | 10/2003 | Karlicek, Jr. |
| 2003/0193801 A1 | 10/2003 | Lin et al. |
| 2003/0199122 A1 | 10/2003 | Wada et al. |
| 2003/0223210 A1 | 12/2003 | Chin |
| 2004/0007981 A1 | 1/2004 | Shibata et al. |
| 2004/0055784 A1 | 3/2004 | Joshi et al. |
| 2004/0060969 A1 | 4/2004 | Imai et al. |
| 2004/0087190 A1 | 5/2004 | Miyazawa et al. |
| 2004/0090403 A1 | 5/2004 | Huang |
| 2004/0239243 A1 | 12/2004 | Roberts et al. |
| 2004/0264148 A1 | 12/2004 | Burdick, Jr. et al. |
| 2005/0056923 A1 | 3/2005 | Moshayedi |
| 2005/0067472 A1 | 3/2005 | Ohtsuki et al. |
| 2005/0133800 A1 | 6/2005 | Park et al. |
| 2005/0207156 A1* | 9/2005 | Wang et al. .......... 362/240 |
| 2005/0239300 A1 | 10/2005 | Yasumura et al. |
| 2005/0242160 A1 | 11/2005 | Nippa et al. |
| 2005/0272276 A1 | 12/2005 | Ooyabu |
| 2006/0000877 A1 | 1/2006 | Wang et al. |
| 2006/0025023 A1 | 2/2006 | Ikeda et al. |
| 2006/0038542 A1 | 2/2006 | Park et al. |
| 2006/0128174 A1 | 6/2006 | Jang et al. |
| 2006/0181878 A1 | 8/2006 | Burkholder |
| 2006/0220051 A1* | 10/2006 | Fung et al. .......... 257/99 |
| 2006/0221609 A1 | 10/2006 | Ryan |
| 2006/0245174 A1 | 11/2006 | Ashdown et al. |
| 2006/0284640 A1 | 12/2006 | Wang et al. |
| 2007/0015417 A1 | 1/2007 | Caveney et al. |
| 2007/0054517 A1 | 3/2007 | Hidaka et al. |
| 2007/0077688 A1 | 4/2007 | Hsu et al. |
| 2007/0157464 A1 | 7/2007 | Jeon et al. |
| 2007/0171145 A1 | 7/2007 | Coleman et al. |
| 2007/0184675 A1 | 8/2007 | Ishikawa et al. |
| 2007/0194428 A1 | 8/2007 | Sato et al. |
| 2007/0210722 A1 | 9/2007 | Konno et al. |
| 2007/0216987 A1* | 9/2007 | Hagood .......... G02B 26/02 359/298 |
| 2007/0217202 A1 | 9/2007 | Sato |
| 2007/0252268 A1* | 11/2007 | Chew et al. .......... 257/714 |
| 2007/0257623 A1 | 11/2007 | Johnson et al. |
| 2008/0031640 A1 | 2/2008 | Fukui |
| 2008/0045077 A1 | 2/2008 | Chou et al. |
| 2008/0138576 A1 | 6/2008 | Nozu et al. |
| 2008/0143379 A1 | 6/2008 | Norman |
| 2008/0160795 A1 | 7/2008 | Chen et al. |
| 2008/0191642 A1 | 8/2008 | Slot et al. |
| 2008/0232047 A1 | 9/2008 | Yamada et al. |
| 2008/0249363 A1 | 10/2008 | Nakamura et al. |
| 2008/0254653 A1 | 10/2008 | Uka |
| 2008/0310141 A1 | 12/2008 | Mezouari |
| 2008/0311771 A1 | 12/2008 | Cho |
| 2009/0029570 A1 | 1/2009 | Ikeuchi et al. |
| 2009/0079357 A1 | 3/2009 | Shteynberg et al. |
| 2009/0103302 A1* | 4/2009 | Lin et al. .......... 362/257 |
| 2009/0117373 A1 | 5/2009 | Wisniewski et al. |
| 2009/0140415 A1 | 6/2009 | Furuta |
| 2009/0191725 A1 | 7/2009 | Vogt et al. |
| 2009/0205200 A1 | 8/2009 | Rosenblatt et al. |
| 2009/0226656 A1 | 9/2009 | Crandell et al. |
| 2009/0230883 A1 | 9/2009 | Haug |
| 2009/0251068 A1 | 10/2009 | Holec et al. |
| 2009/0301544 A1 | 12/2009 | Minelli |
| 2009/0308652 A1 | 12/2009 | Shih |
| 2010/0008090 A1 | 1/2010 | Li et al. |
| 2010/0018763 A1 | 1/2010 | Barry |
| 2010/0026208 A1 | 2/2010 | Shteynberg et al. |
| 2010/0059254 A1 | 3/2010 | Sugiyama et al. |
| 2010/0093190 A1 | 4/2010 | Miwa et al. |
| 2010/0109536 A1 | 5/2010 | Jung et al. |
| 2010/0110682 A1 | 5/2010 | Jung et al. |
| 2010/0167561 A1 | 7/2010 | Brown et al. |
| 2010/0187005 A1 | 7/2010 | Yeh |
| 2010/0213859 A1 | 8/2010 | Shteynberg et al. |

(56) References Cited

U.S. PATENT DOCUMENTS

| | | | |
|---|---|---|---|
| 2010/0220046 A1* | 9/2010 | Plotz et al. | 345/102 |
| 2010/0308738 A1 | 12/2010 | Shteynberg et al. | |
| 2010/0308739 A1 | 12/2010 | Shteynberg et al. | |
| 2011/0024180 A1 | 2/2011 | Ko | |
| 2011/0051448 A1 | 3/2011 | Owada | |
| 2011/0096545 A1 | 4/2011 | Chang et al. | |
| 2011/0115411 A1 | 5/2011 | Shteynberg et al. | |
| 2011/0121754 A1 | 5/2011 | Shteynberg et al. | |
| 2011/0157897 A1 | 6/2011 | Liao et al. | |
| 2011/0177700 A1 | 7/2011 | Jia et al. | |
| 2011/0230067 A1 | 9/2011 | Champion et al. | |
| 2011/0309759 A1 | 12/2011 | Shteynberg et al. | |
| 2011/0311789 A1 | 12/2011 | Loy et al. | |
| 2012/0002438 A1 | 1/2012 | Gourlay | |
| 2012/0014108 A1 | 1/2012 | Greenfield et al. | |
| 2012/0068622 A1 | 3/2012 | Ward | |
| 2012/0081009 A1 | 4/2012 | Shteynberg et al. | |
| 2012/0081018 A1 | 4/2012 | Shteynberg et al. | |
| 2012/0097784 A1 | 4/2012 | Liao et al. | |
| 2012/0162990 A1 | 6/2012 | Crandell et al. | |
| 2012/0188771 A1 | 7/2012 | Kraus et al. | |
| 2012/0195024 A1 | 8/2012 | Kawaguchi et al. | |
| 2013/0070452 A1 | 3/2013 | Urano et al. | |
| 2014/0015414 A1 | 1/2014 | Holec et al. | |
| 2014/0168982 A1 | 6/2014 | Crandell et al. | |
| 2014/0197743 A1 | 7/2014 | Holec et al. | |
| 2015/0173183 A1 | 6/2015 | Holec et al. | |
| 2015/0189765 A1 | 7/2015 | Holec et al. | |
| 2017/0055346 A1 | 2/2017 | Holec et al. | |
| 2018/0063968 A1 | 3/2018 | Holec et al. | |

FOREIGN PATENT DOCUMENTS

| | | |
|---|---|---|
| CN | 102788284 | 11/2012 |
| EP | 0961351 | 12/1999 |
| EP | 2888517 | 7/2015 |
| GB | 2483942 | 3/2012 |
| JP | 01319993 | 12/1989 |
| JP | 05090726 | 4/1993 |
| JP | 05090749 | 4/1993 |
| JP | 2002043737 | 2/2002 |
| JP | 2002117707 | 4/2002 |
| JP | 2005285960 | 10/2005 |
| JP | 2006080227 | 3/2006 |
| JP | 2011169791 | 9/2011 |
| WO | 2011064107 | 3/2013 |
| WO | 2014031567 | 2/2014 |

OTHER PUBLICATIONS

"Notice of Allowance", from U.S. Appl. No. 13/190,639, dated Apr. 4, 2013 (12 pages).

"Notice of Allowance", from U.S. Appl. No. 13/411,322, dated May 10, 2013 (29 pages).

"Notice of Allowance", dated Dec. 3, 2012 in co pending U.S. Appl. No. 12/419,879, "Solid State Lighting Circuit and Controls" (17 pages).

"Notice of Allowance", for U.S. Appl. No. 13/190,639, dated Mar. 7, 2013 (10 pages).

"Response to Non-Final Office Action", dated Oct. 1, 2012 in U.S. Appl. No. 13/411,322, "Layered Structure for Use With High Power Light Emitting Diode Systems" (6 pages).

"3M Thermally Conductive Adhesive Transfer Tapes—Technical Data", Electronic Adhesives and Specialties Department, Engineered Adhesives Division, Sep. 2002, (6 pages).

Murray, Cameron T. et al., "3M Thermally Conductive Tapes", 3M Electronic Markets Materials Division, Mar. 2004 (39 pages).

"Custom LUXEON Design Guide", Application Brief AB12, Mar. 2006 (14 pages).

"DERWENT-ACC-No. 1984-298425", corresponds to JP-59-186388A (1984).

"DERWENT-ACC-No. 2010-J09039", corresponds to JP-2010-153549A (1984).

"DRAGONtape DT6 Data Sheet", Sep. 2007 (4 pages).

"DRAGONtape Product Information Bulletin", 2007 (2 pages).

"DRAGONtape Product Information Bulletin", OSRAM, Nov. 2005 (4 pages).

"File History", for co-pending U.S. Appl. No. 12/372,499, "Printed Circuit Board Flexible Interconnect Design" filed on Feb. 17, 2009 (254 pages).

"File History", for co-pending U.S. Appl. No. 12/406,761, "Printed Circuit Board Interconnect Construction," filed on Mar. 18, 2009 (244 pages).

"Final Office Action", dated Aug. 7, 2012 in U.S. Appl. No. 13/190,639, "Interconnectable Circuit Boards," (25 pages).

"Final Office Action", dated Mar. 15, 2012 in co pending U.S. Appl. No. 12/419,879, "Solid State Lighting Circuit and Controls" (10 pages).

"FLEX Connectors User's Guide", OSRAM Sylvania, Oct. 2007 (6 pages).

"FR406 High Performance Epoxy Laminate and Prepreg", Isola, 2006 (2 pages).

"FR406: High Performance Epoxy Laminate and Prepreg", http://www.isola-group.com/en/products/name/details.shtl?13, Mar. 2008 (1 page).

"High Performance Epoxy Laminate and Prepreg", Isola, Mar. 2007 (3 pages).

"IPC-4101B: Specification for Base Materials for Rigid and Multilayer Printed Boards", Mar. 2006 (109 pages).

"Kapton Polyimide Film", DuPont Electronics, http://www2.dupont.com/Kapton/en_US/index.html, Feb. 2008 (9 pages).

"Linear Products", OSRAM Sylvania, http://www.sylvanaia.com/BusinessProducts/Innovations/LED+Systems/Linear/, 2004 (1 page).

"LINEARlight Flex & Power Flex LED Systems", OSRAM Sylvania, http://www/sylvania.com/AboutUs/Pressxpress/Innovation/LightingNews(US)/2007/USLi, Sep. 2007 (3 pages).

"LINEARlight Flex TOPLED: Flexible LED Strip", Osran Sylvania LED Systems Specification Guide, 2007 (p. 100).

"LINEARlight Power Flex: Flexible High Light Output LED Modules", OSRAM Sylvania, Apr. 2008 (4 pages).

"LINEARlight Power Flex: Flexible LED Strip", Osran Sylvania LED Systems Specification Guide, 2007 (p. 96).

"LINEARlight Power Flex: LM1OP Data Sheet", May 2007 (4 pages).

"Nichia Application Note", Oct. 2003 (p. 5).

"Non Final Office Action", dated Mar. 5, 2012 in co pending U.S. Appl. No. 13/190,639, "Printed Circuit Board Interconnect Construction" (12 pages).

"Non Final Office Action", dated Jul. 26, 2011 in co pending U.S. Appl. No. 12/419,879, "Solid State Lighting Circuit and Controls" (16 pages).

"Non-Final Office Action", dated Aug. 22, 2012 in co-pending U.S. Appl. No. 13/158,149, "Flexible Circuit Board Interconnection and Methods" (27pages).

"Non-Final Office Action", dated Oct. 1, 2012 in U.S. Appl. No. 13/411,322, "Layered Structure for Use With High Power Light Emitting Diode Systems," (18 pages).

"Non-Final Office Action", dated Aug. 3, 2012 in U.S. Appl. No. 12/419,879, "Solid State Lighting Circuit and Controls," (17 pages).

"Notice of Allowance", dated Nov. 26, 2012 in co-pending U.S. Appl. No. 13/190,639, "Printed Circuit Board Interconnect Construction," (15 pages).

"Notice of Allowance", dated Nov. 16, 2011 in co-pending U.S. Appl. No. 12/043,424, "Layered Structure for Use With High Power Light Emitting Diode Systems," (9 pages).

"NUD4001—High Current LED Driver", Semiconductor Components Industries, LLC, http://onsemi.com, Jun. 2006 (8 pages).

"Product Information Bulletin HF2STick XB: Hi-Flux 2nd Generation Module", OSRAM Sylvania, Jan. 2008 (4 pages).

"Response to Final Office Action", dated Mar. 15, 2012 in co-pending U.S. Appl. No. 12/419,879, filed with USPTO Jun. 15, 2012 (8 pages).

(56) References Cited

OTHER PUBLICATIONS

"Response to Final Office Action", dated Aug. 7, 2012, in co-pending U.S. Appl. No. 13/190,639, file with USPTO Nov. 7, 2012 (14 pages).
"Response to Non-Final Office Action", dated Aug. 3, 2012 in co-pending U.S. Appl. No. 12/419,879, filed with USPTO Nov. 5, 2012 (7 pages).
"Response to Non-Final Office Action", dated Jul. 26, 2011 in co-pending U.S. Appl. No. 12/419,879, filed with USPTO Dec. 27, 2011 (7 pages).
"Restriction Requirement", dated Sep. 7, 2011 in co-pending U.S. Appl. No. 13/190,639, "Printed Circuit Board Interconnect Construction" (6 pages).
"Specifications for Nichia Chip Type Warm White LED Model: NS6L083T", Nichia Corporation, No. STSE-CC6063A, <Cat.No. 060609> (3 pages).
"Specifications for Nichia Chip Type White LED Model: NS6W083AT", Nichia Corporation, No. STSE-CC7134, <Cat.No.070706> (14 pages).
"TechniMask ISR 1000 Series", Technic, Inc., http://www.technic.com/pwb/solderisr1000.htm, 2003 (1 page).
"Thermal Management for LED Applications Solutions Guide", The Bergquist Company (6 pages).
"T-lam System—Thermally Conductive Circuit Board Materials", http://www.lairdtech.com/pages/products/T-Lam-System.asp, Feb. 2008 (7 pages).
O'Malley, Kleran, "Using the NUD4001 to Drive High Current LEDs", http;//onsemi.com, Feb. 2005 (4 pages).
"Final Office Action," for U.S. Appl. No. 14/015,679, dated Dec. 16, 2014 (19 pages).
"International Search Report and Written Opinion," for PCT/US2013/055658, dated Jan. 15, 2014 (10 pages).
"Non-Final Office Action," for U.S. Appl. No. 13/158,149, dated Jul. 3, 2013 (32 pages).
"Non-Final Office Action," for U.S. Appl. No. 13/944,610, dated Mar. 18, 2014 (2o0 pages).
"Non-Final Office Action," for U.S. Appl. No. 14/015,679, dated Apr. 1, 2014 (7 pages).
"Non-Final Office Action," for U.S. Appl. No. 14/216,182, dated Nov. 26, 2014 (7 pages).
"Notice of Allowance," for U.S. Appl. No. 13/944,610, dated Nov. 18, 2013 (11 pages).
"Notice of Allowance," for U.S. Appl. No. 13/944,610, dated Oct. 31, 2014 (11 pages).
"Notice of Allowance," for U.S. Appl. No. 13/158,149, dated Feb. 11, 2014 (12 pages).
"Notice of Allowance," for U.S. Appl. No. 13/158,149, dated Jun. 6, 2014 (12 pages).
"Notice of Allowance," for U.S. Appl. No. 13/791,228, dated Dec. 10, 2013 (36 pages).
"Response to Final Office Action," for U.S. Appl. No. 12/372,499, dated Oct. 27, 2010 (7 pages).
"Response to Final Office Action," for U.S. Appl. No. 12/406,761 dated Oct. 12, 2010 (10 pages).
"Response to Final Office Action," for U.S. Appl. No. 12/158,149, dated Jun. 6, 2013 (10 pages).
"Response to Non-Final Office Action," for U.S. Appl. No. 13/158,149 dated Feb. 21, 2013 (12 pages).
"Response to Non-Final Office Action," for U.S. Appl. No. 13/160,639 dated Jul. 26, 2012 (17 pages).
"Response to Non-Final Office Action," for U.S. Appl. No. 13/158,149, dated Jan. 2, 2014 (14 pages).
"Response to Non-Final Office Action," for U.S. Appl. No. 13/944,610, dated Mar. 18, 2014 and filed with the USPTO Sep. 18, 2014 (9 pages).
"Response to Non-Final Office Action," for U.S. Appl. No. 14/015,679, dated Apr. 1, 2014 and filed with the USPTO Oct. 1, 2014 (6 pages).
"Communication Pursuant to Rules 161(1) and 162 EPC," for European Patent Application No. 13763341.8, dated Apr. 7, 2015 (2 pages).
"International Preliminary Report on Patentability," for PCT/US2013/055658, dated Mar. 5, 2015 (7 pages).
"Non-Final Office Action," for U.S. Appl. No. 14/506,251 dated Sep. 29, 2015 (38 pages).
"Non-Final Office Action," for U.S. Appl. No. 14/015,679, dated Jun. 19, 2015 (9 pages).
"Response Non-Final Office Action," for U.S. Appl. No. 14/015,679, dated Jun. 19, 2015 and filed with the USPTO Sep. 18, 2015 (5 pages).
"Response to Final Office Action," for U.S. Appl. No. 14/015,679, dated Dec. 16, 2014 and filed with the USPTO May 15, 2015 (5 pages).
"Final Office Action," for U.S. Appl. No. 14/506,251, dated Mar. 15, 2016 (17 pages).
"Notice of Allowance," for U.S. Appl. No. 14/014,679 dated Jan. 13, 2016 (10 pages).
"Notice of Allowance," for U.S. Appl. No. 14/015,679 dated Oct. 26, 2015 (10 pages).
"Notice of Allowance," for U.S. Appl. No. 14/633,726, dated Jan. 25, 2016 (35 pages).
"Response to Non-Final Office Action," for U.S. Appl. No. 14/506,251 dated Sep. 29, 2015 and filed with the USPTO Jan. 27, 2016 (10 pages).
"Non-Final Office Action," for U.S. Appl. No. 15/165,678, dated Jan. 20, 2017 (31 pages).
"Response to Non-Final Office Action," for U.S. Appl. No. 14/506,251, dated Dec. 9, 2016 and filed with the USPTO Mar. 23, 2017 (6 pages).
"Non-Final Office Action," for U.S. Appl. No. 14/506,251 dated Dec. 9, 2016 (11 pages).
"Response to Final Office Action," for U.S. Appl. No. 14/506,251, dated Mar. 15, 2016 and filed with the USPTO Sep. 15, 2016 (10 pages).
"Final Office Action," for U.S. Appl. No. 15/165,678 dated Jul. 11, 2018 (10 pages).
"Response to Non-Final Office Action," for U.S. Appl. No. 15/165,678, filed with the USPTO May 30, 2018 (17 pages) for Non-Final Office Action dated Feb. 16, 2018.
"Final Office Action," for U.S. Appl. No. 15/165,678 dated Jul. 31, 2017 (13 pages).
"Response to Non-Final Office Action," for U.S. Appl. No. 15/165,678, mailed Jan. 20, 2017 and filed with the USPTO Jul. 20, 2017 (10 pages).
"Non-Final Office Action," for U.S. Appl. No. 15/165,678 dated Feb. 16, 2018 (22 pages).
"Response to Final Office Action," for U.S. Appl. No. 15/165,678, dated Jul. 31, 2017 and filed with the USPTO Jan. 18, 2018 (12 pages).
"Non-Final Office Action," for U.S. Appl. No. 15/165,678 dated Oct. 18, 2018 (10 pages).
"Non-Final Office Action," for U.S. Appl. No. 15/675,938 dated Oct. 9, 2018 (40 pages).
"Response to Non-Final Office Action," for U.S. Appl. No. 15/165,678 filed with the USPTO Jan. 2, 2019 (10 pages).
"Response to Non-Final Office Action," for U.S. Appl. No. 15/675,938 filed with the USPTO Jan. 2, 2019 (10 pages).
"Final Office Action," for U.S. Appl. No. 15/165,678 dated Mar. 12, 2019 (16 pages).
"Final Office Action," for U.S. Appl. No. 15/675,938 dated Feb. 20, 2019 (17 pages).

\* cited by examiner

LED LIGHTING SYSTEMS AND METHODS

This application is a continuation-in-part of U.S. application Ser. No. 13/158,149, filed Jun. 10, 2011, now U.S. Pat. No. 8,851,356 which is a continuation-in-part of U.S. application Ser. No. 12/372,499, filed Feb. 17, 2009, now U.S. Pat. No. 7,980,863, which claims the benefit of U.S. Provisional Application No. 61/028,779, filed Feb. 14, 2008, and U.S. Provisional Application No. 61/037,595, filed on Mar. 18, 2008, the contents of all of which are herein incorporated by reference. This application is also a continuation-in-part of U.S. application Ser. No. 13/190,639, filed Jul. 26, 2011, now U.S. Pat. No. 8,500,456 which is a continuation of U.S. application Ser. No. 12/406,761, filed Mar. 18, 2009, now U.S. Pat. No. 8,007,286, which claims the benefit of U.S. Provisional Application No. 61/037,595, filed on Mar. 18, 2008, and U.S. Provisional Application No. 61/043,006, filed Apr. 7, 2008, the contents of all of which are herein incorporated by reference. This application is also a continuation-in-part of U.S. application Ser. No. 13/411,322, filed Mar. 2, 2012, now U.S. Pat. No. 8,525,193 which is a continuation of U.S. application Ser. No. 12/043,424, filed Mar. 6, 2008, now U.S. Pat. No. 8,143,631, the contents of all of which are herein incorporated by reference.

FIELD OF THE INVENTION

The present invention relates to light emitting diode (LED) lighting system and methods.

BACKGROUND OF THE INVENTION

Solid state lighting (SSL) circuits (or LED lighting systems) are predicted to achieve widespread adoption in commercial lighting applications. Solid state lighting is more efficient in converting electricity to light than incandescent, fluorescent, and compact fluorescent systems. As such solid state lighting stands to greatly increase the energy efficiency of many lighting applications including street lighting, sign lighting, residential lighting, commercial lighting, etc.

SUMMARY OF THE INVENTION

Embodiments of the invention include LED lighting systems and methods. For example, in some embodiments, an LED lighting system is included. The LED lighting system can include a flexible layered circuit structure that can include a top thermally conductive layer, a middle electrically insulating layer, a bottom thermally conductive layer, and a plurality of light emitting diodes mounted on the top layer. The LED lighting system can further include a housing substrate and a mounting structure. The mounting structure can be configured to suspend the layered circuit structure above the housing substrate with an air gap disposed in between the bottom thermally conductive layer of the flexible layered circuit structure and the housing substrate. The distance between the layered circuit structure and the support layer can be at least about 0.5 mm. In some embodiments, the flexible layered circuit structure is attached to the mounting structure in a releasable manner. In some embodiments, the flexible layered circuit structure is releasable from the mounting structure without the use of tools. In some embodiments, the flexible layered circuit structure is configured for replacement.

In some embodiments, an LED lighting system is included. The LED lighting system can include a flexible layered circuit structure can include a top thermally conductive layer, a middle electrically insulating layer, a bottom thermally conductive layer, a plurality of light emitting diodes mounted on the bottom layer, a housing substrate, and a mounting structure. The mounting structure can be configured to suspend the layered circuit structure above the housing substrate with an air gap disposed in between bottom thermally conductive layer of the flexible layered circuit structure and the housing substrate, wherein the distance between the layered circuit structure and the support layer is at least about 0.5 mm.

In some embodiments, a method for making an LED lighting system is included. The method for making an LED lighting system can include obtaining a flexible layered circuit structure that can include, a top thermally conductive layer, a middle electrically insulating layer, a bottom thermally conductive layer. The method can further include suspending the flexible layered circuit structure above a housing substrate with an air gap disposed in between the bottom thermally conductive layer of the flexible layered circuit structure and the housing substrate, wherein the distance between the layered circuit structure and the housing substrate is at least about 0.5 mm, and connecting the flexible layered circuit structure to a power source.

In some embodiments, a method for operating an LED lighting system is included. The method for operating an LED lighting system can include providing electrical current to an LED lighting circuit, the LED lighting circuit including a plurality of light emitting diodes, the LED lighting circuit disposed upon a flexible layered circuit structure can include a top thermally conductive layer, a middle electrically insulating layer, a bottom thermally conductive layer, and dissipating heat from the light emitting diodes to ambient air through the top surface of the top thermally conductive layer and the bottom surface of the bottom thermally conductive layer.

In some embodiments, an LED lighting system is included. The LED lighting system can include a flexible layered circuit structure can include a top thermally conductive layer, a middle electrically insulating layer, a bottom thermally conductive layer, a plurality of light emitting diodes mounted on the top layer, the flexible layered circuit structure formed into a loop. The loop can be disposed within a housing. The loop can be separated from the housing by an air gap. The loop can be disposed sideways to the support structure.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope of the present invention is defined by the appended claims and their legal equivalents.

BRIEF DESCRIPTION OF THE FIGURES

The invention may be more completely understood in connection with the following drawings, in which.

While the invention is susceptible to various modifications and alternative forms, specifics thereof have been shown by way of example and drawings, and will be described in detail. It should be understood, however, that the invention is not limited to the particular embodiments described. On the contrary, the intention is to cover modifications, equivalents, and alternatives falling within the spirit and scope of the invention.

DETAILED DESCRIPTION OF THE INVENTION

The embodiments of the present invention described herein are not intended to be exhaustive or to limit the invention to the precise forms disclosed in the following detailed description. Rather, the embodiments are chosen and described so that others skilled in the art can appreciate and understand the principles and practices of the present invention.

All publications and patents mentioned herein are hereby incorporated by reference. The publications and patents disclosed herein are provided solely for their disclosure. Nothing herein is to be construed as an admission that the inventors are not entitled to antedate any publication and/or patent, including any publication and/or patent cited herein.

Solid state lighting stands to greatly increase the energy efficiency of many lighting applications including street lighting, sign lighting, residential lighting, commercial lighting, etc. However, one design challenge associated with LED lighting systems is the dissipation of heat. In particular, it is important consider the junction temperature in an LED (the p-n junction temperature) lighting system. If this temperature rises above the prescribed level recommended by the LED manufacturer, the lifetime of the LED as well as its intensity and color may be affected.

Mounting an LED carrying circuit on a heat sink, or adding secondary heat sinks is one approach to heat dissipation. However, this can add additional cost to the finished product in addition to constraining design flexibility. Applicants have developed various embodiments of LED lighting systems that can provide sufficient heat dissipation without the need for directly mounting the LED carrying circuit onto a large heat sink or any substantial secondary heat sinks. Such embodiments can successfully maintain the junction temperature of the LEDs below the critical temperature.

Figure 1A:
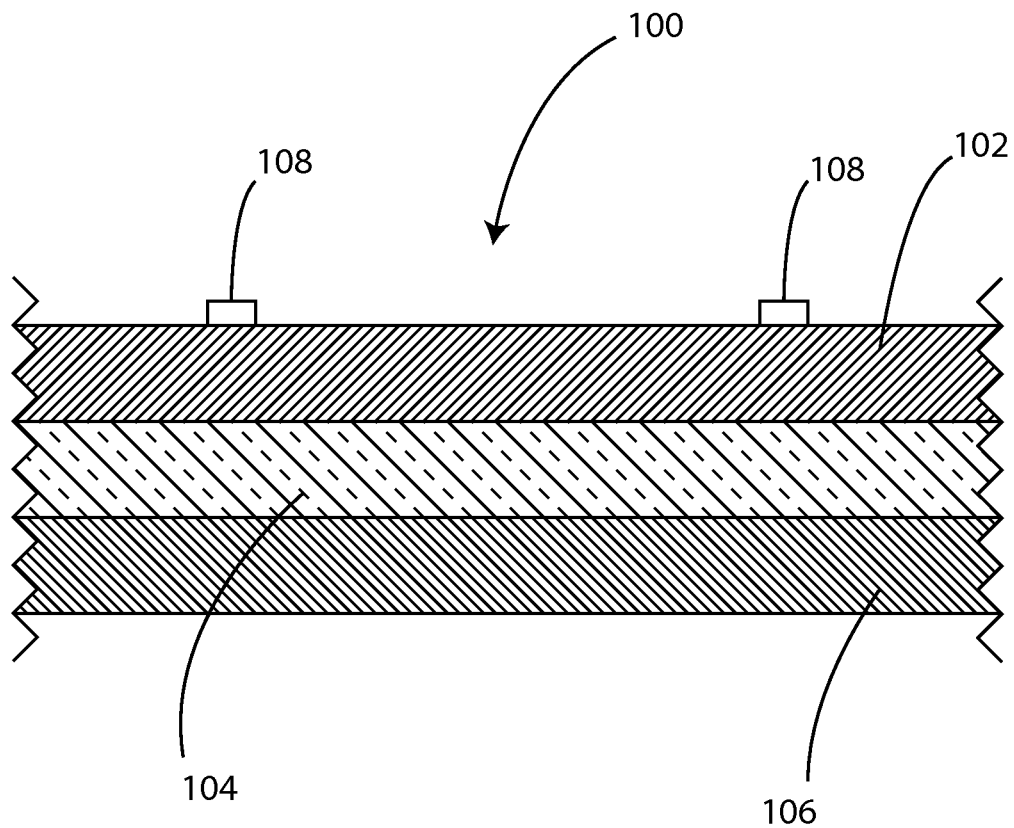
FIG. 1A is a cross sectional schematic view of a flexible layered circuit structure in accordance with various embodiments herein.

Referring now to FIG. 1A, a cross sectional schematic view is shown of a flexible layered circuit structure 100 in accordance with various embodiments herein. The flexible layered circuit structure can include a top thermally conductive layer 102, a middle electrically insulating layer 104, and a bottom thermally conductive layer 106. In some embodiments, the top, middle, and bottom layers combined have a thermal resistance of less than 10 degrees Celsius per Watt. A plurality of light emitting diodes 108 can be mounted on the top thermally conductive layer 102. When electrical current is passed through the circuit on the top surface of the top thermally conductive layer, one or more of the LEDs can be energized and emit visible light.

In some embodiments, a commercially available FR4 material can be used as a starting material and is modified to create the layered circuit structure. The FR4 material preferably includes a layer of fiberglass sandwiched between two layers of copper. An example of a suitable FR4 material is FR406 manufactured by Isola Group of Chandler, Ariz. The top layer can include one of the two layers of copper, the intermediate layer can include a layer of fiberglass, and the bottom layer can include the other of the two layers of copper. It is recognized that other suitable FR4 materials could be used and that these layers could be either manufactured or purchased in this form.

Prior to modification, the top layer can be copper approximately 0.5 to 4.0 ounces per square foot and approximately 0.0007 to 0.0056 inch thick, 0.25 to 48.00 inches wide, and 0.50 to 48.00 inches long. Although copper is a preferred material, it is recognized that other suitable electrically conductive materials such as but not limited to aluminum could be used. The top, copper layer can be modified to include a thermally conductive printed or etched electrical circuit using standard electrical circuit design tools and techniques well known in the art and can then be coated with a protective coating using standard solder masking and labeling techniques. An example of a suitable protective coating that could be used is TechniMask ISR 1000 manufactured by Technic, Inc. of Cranston, R.I. The top layer can be designed in such a way as to provide receptacles and mounting surfaces for LEDs and other SMT electrical components proximate the top surface.

The intermediate layer can be an electrically insulating thermally conductive layer, in some embodiments made of fiberglass approximately 0.005 to 0.020 inch thick, 0.25 to 48.00 inches wide, and 0.50 to 48.00 inches long. The fiberglass has a breakdown voltage of greater than 5 kilovolts (kV), a tensile strength of 55 kips per square inch (ksi), and a flexural strength of 91 kips per square inch (ksi). The thermal conductivity of the fiberglass can be 0.3 to 0.4 Watts per meter per degrees Kelvin (W/mK). Although fiberglass is a preferred material, it is recognized that other suitable materials such as but not limited to polymer or ceramic blended dielectrics may be used.

Prior to modification, the bottom layer can be copper approximately 0.5 to 4.0 ounces per square foot and can be approximately 0.0007 to 0.0056 inch thick, 0.25 to 48.00 inches wide, and 0.50 to 48.00 inches long. Although copper is a preferred material, it is recognized that other suitable electrically conductive materials such as but not limited to aluminum could be used. The bottom, copper layer can be modified into a heat spreading copper circuit laterally and along its longitudinal axis proximate the bottom surface in order to rapidly spread the heat through the bottom layer. In some embodiments, the exposed copper proximate the bottom surface of the bottom layer can then be tinned. The bottom layer can include thermally conductive printed circuits, which are printed or etched using solder mask printing, photo etching, and solder masking techniques well known in the art for producing electrical circuits. In various embodiments, the bottom layer can include solid coverage of thermally conductive material (such as copper) across an area equal to a majority of the surface area with no direct electrical connection to the top layer.

The flexible layered circuit structure can be at least semi-flexible in some embodiments, not rigid. The flexible layered circuit structure can be any desired length, which could be as long as 250 feet or more. The strip can bend (for example along the lengthwise axis in a direction from the top of the flexible layered circuit structure to the bottom of the flexible layered circuit structure, or bottom to top) sufficiently to achieve a radius of curvature of 6 inches. In some embodiments, the strip can bend sufficiently to achieve a radius of curvature of 1 inch. In some embodiments, the flexible layered circuit structure can be wrapped about the hub of a reel for storage until use. The flexible layered circuit structure can also twist relative to its longitudinal axis up to 10 degrees per inch.

Figure 1B:
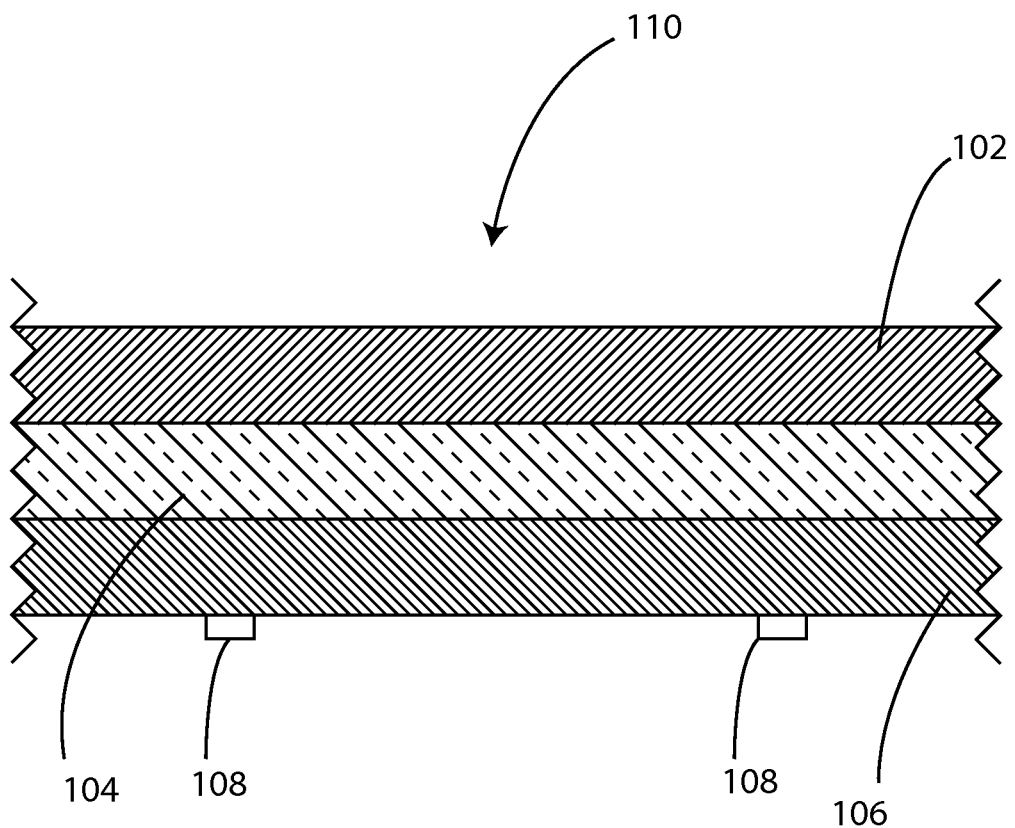
FIG. 1B is a cross sectional schematic view of a flexible layered circuit structure in accordance with various embodiments herein.

In some embodiments, light emitting diodes can be mounted on the bottom layer of the flexible layered circuit structure. Referring now to FIG. 1B, a cross sectional schematic view is shown of a flexible layered circuit structure 110 in accordance with various embodiments herein. The flexible layered circuit structure 110 can include a top thermally conductive layer 102, a middle electrically insulating layer 104, and a bottom thermally conductive layer 106. A plurality of light emitting diodes 108 can be mounted on the bottom thermally conductive layer 106.

Figure 1C:
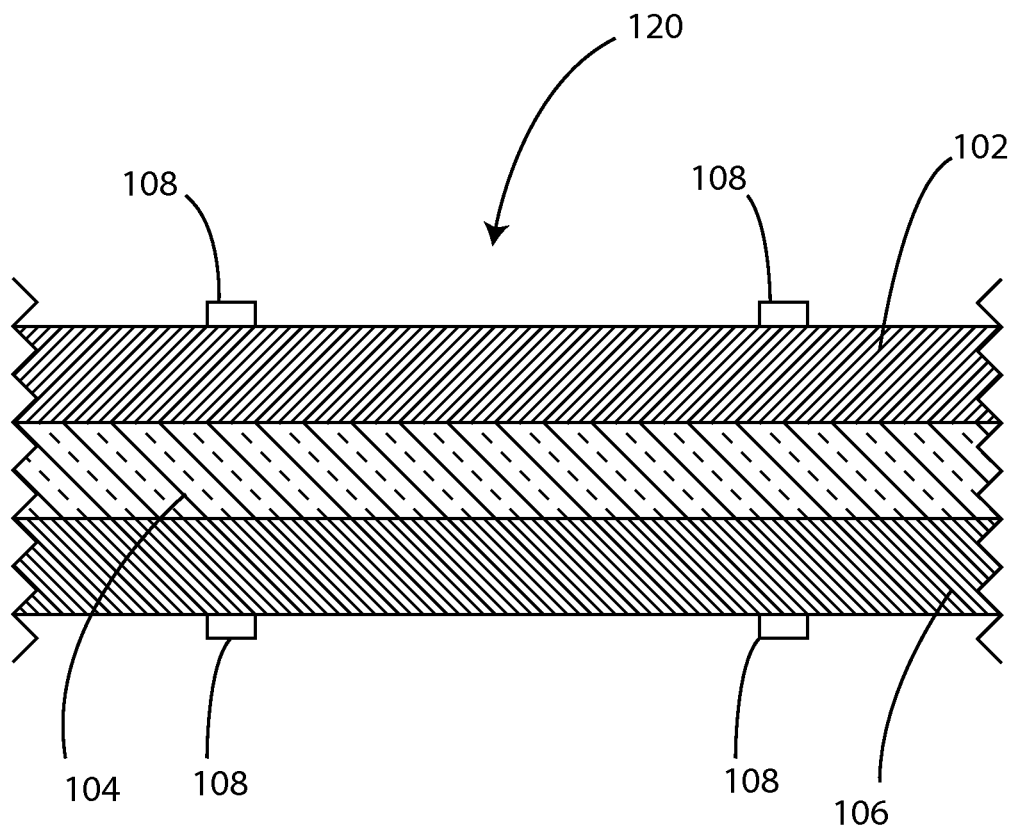
FIG. 1C is a cross sectional schematic view of a flexible layered circuit structure in accordance with various embodiments herein.

In some embodiments, light emitting diodes can be mounted on both the top and the bottom layers of the flexible layered circuit structure. Referring now to FIG. 1C, a cross sectional schematic view is shown of a flexible layered circuit structure 120 in accordance with various embodiments herein. The flexible layered circuit structure 120 can include a top thermally conductive layer 102, a middle electrically insulating layer 104, and a bottom thermally conductive layer 106. A plurality of light emitting diodes 108 can be mounted on the top thermally conductive layer 102 and the bottom thermally conductive layer 106.

Figure 1D:
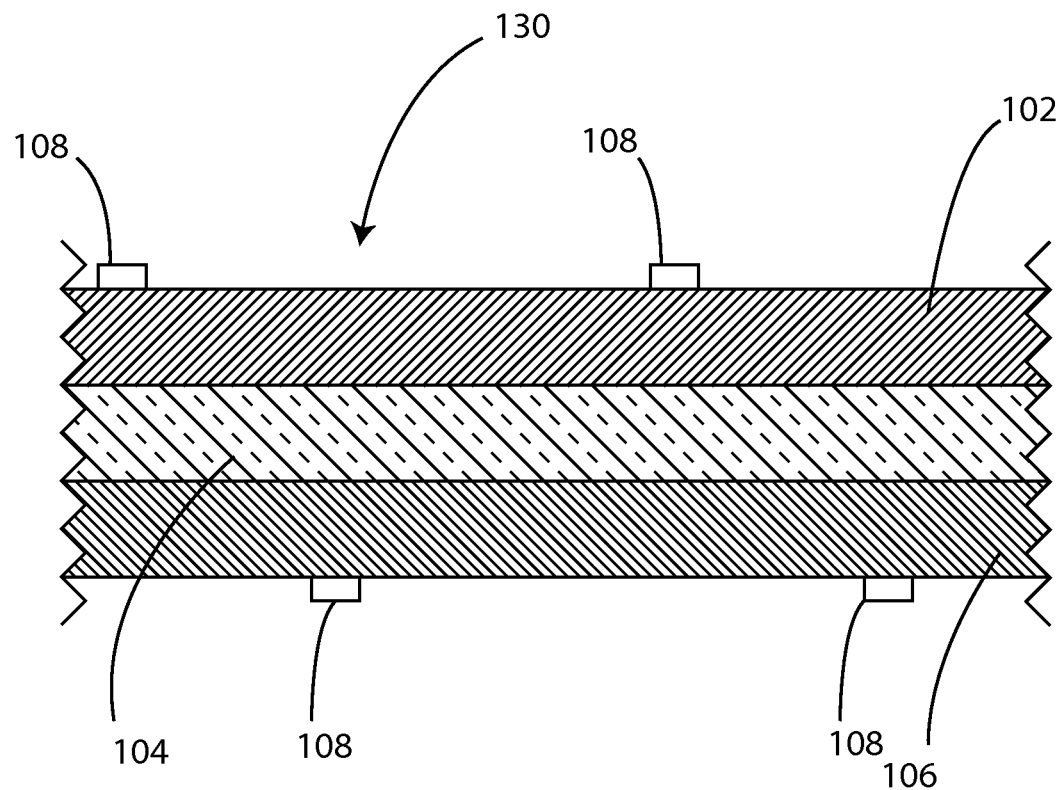
FIG. 1D is a cross sectional schematic view of a flexible layered circuit structure in accordance with various embodiments herein.

When light emitting diodes are mounted on both the top thermally conductive layer 102 and the bottom thermally conductive layer 106, it will be appreciated that the light emitting diodes can be placed directed opposite on another (such as in FIG. 1C) or they can be offset from one another to avoid the concentration of too much heat in a particular spot. Referring now to FIG. 1D, a cross sectional schematic view is shown of a flexible layered circuit structure 130 in accordance with various embodiments herein. The flexible layered circuit structure 130 can include a top thermally conductive layer 102, a middle electrically insulating layer 104, and a bottom thermally conductive layer 106. A plurality of light emitting diodes 108 can be mounted on the top thermally conductive layer 102 and the bottom thermally conductive layer 106, but offset such that the positions of the light emitting diodes 108 on the top do not match with the positions of the light emitting diodes 108 on the bottom.

Figure 2:
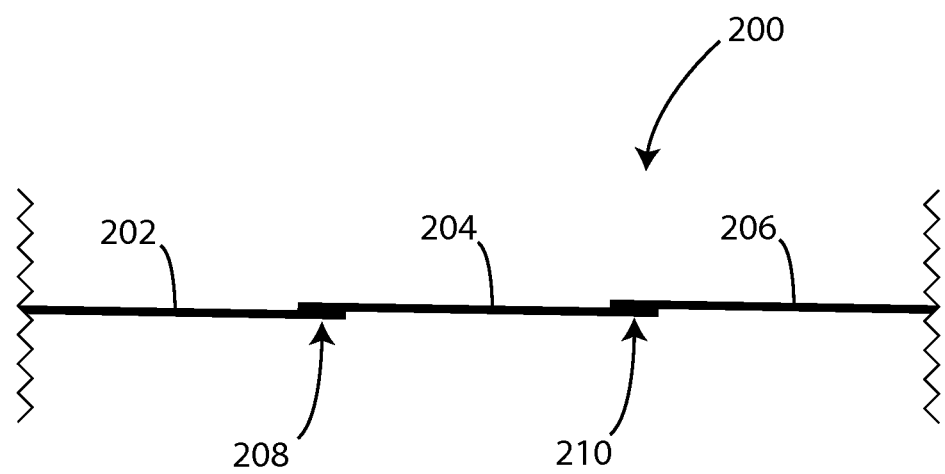
FIG. 2 is a schematic side view of a flexible layered circuit structure in accordance with various embodiments herein.

It will be appreciated that flexible layered circuit structures as used in various embodiments herein can be either be unitary segments or can be formed of multiple segments that are bonded to on another at joints. Referring now to FIG. 2, a schematic side view is shown of a flexible layered circuit structure 200 in accordance with various embodiments herein. In this view, it can be seen that the flexible layered circuit structure is formed of a first segment 202, a second segment 204, and a third segment 206. The first segment 202 is bonded to the second segment 204 at a first overlapping joint 208. The first overlapping joint 208 can provide electrical communication between the circuitry on the first segment 202 and the circuitry on the second segment 204. The second segment 204 is bonded to the third segment 206 at a second overlapping joint 210. The second overlapping joint 210 can provide electrical communication between the circuitry on the second segment 204 and the circuitry on the third segment 206. Connections between segments can continue in this manner such that the overall length of the flexible layered circuit structure can be as long as it desired.

Figure 3:
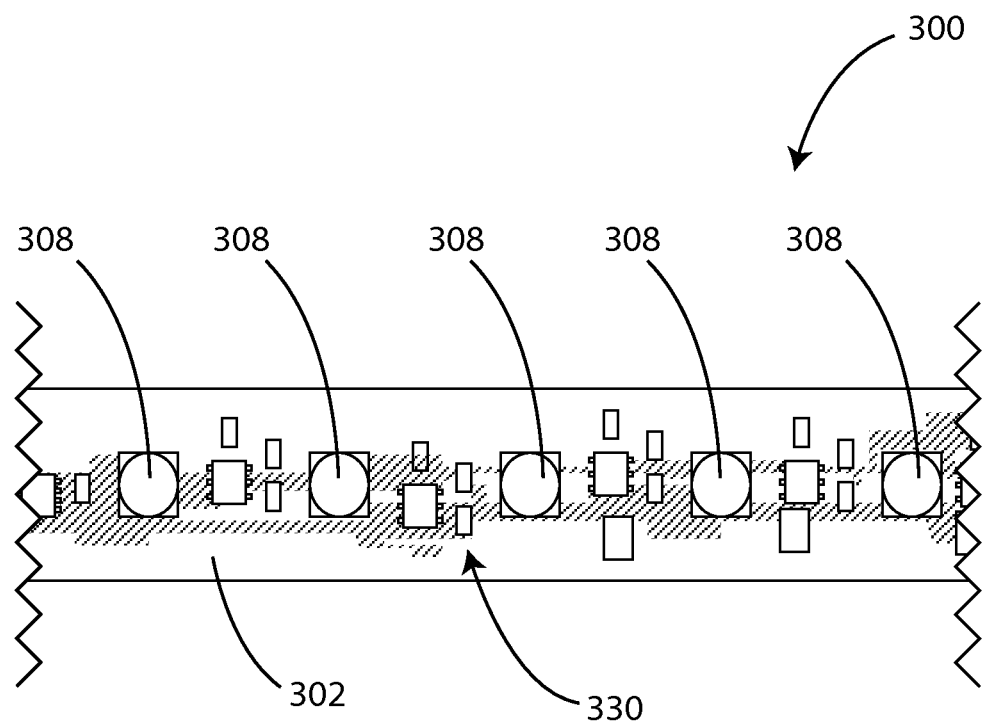
FIG. 3 is a schematic top view of a flexible layered circuit structure in accordance with various embodiments herein.

Referring now to FIG. 3, a schematic top view is shown of a portion 300 of the flexible layered circuit structure 200 of FIG. 2. The flexible layered circuit structure includes a top thermally conductive layer 302. A plurality of light emitting diodes 308 are mounted on the top thermally conductive layer 302. A variety of circuitry and/or components 330 can be etched into or mounted on the top thermally conductive layer 302. The circuitry and components 330 can include various items including, but not limited to, resistors, capacitors, traces, linear drivers, and the like. An example of a suitable LED is NS3W083A manufactured by Nichia Corporation of Detroit, Mich. An example of a suitable liner driver is NUD4001 manufactured by ON Semiconductor of Phoenix, Ariz.

In some embodiments, the light emitting diodes mounted on the top layer have a power of between 0.25 and 3 watts per inch squared of the surface area of the bottom layer.

Figure 4:
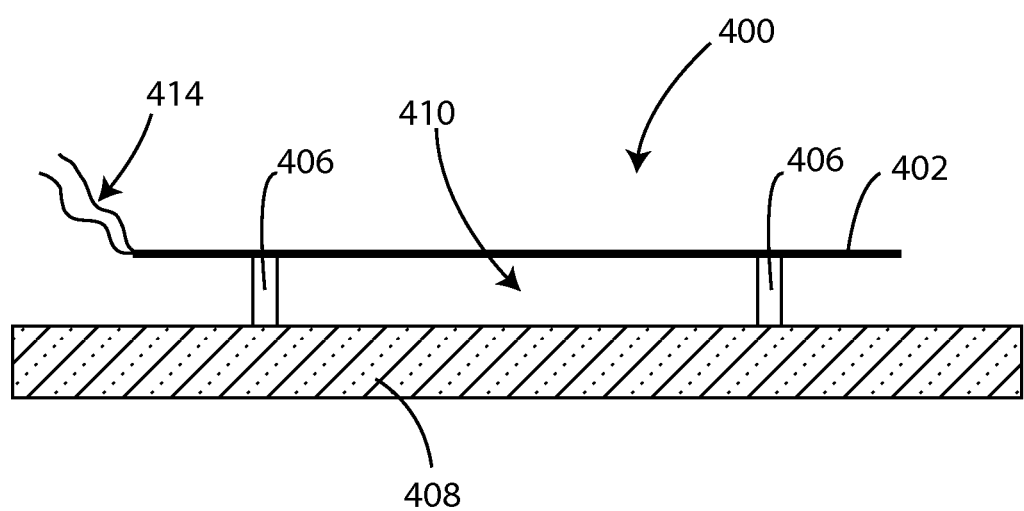
FIG. 4 is a schematic side view of an LED lighting system in accordance with various embodiments herein.

In various embodiments, a mounting structure can be used to suspend the flexible layered circuit structure above a housing substrate. It will be appreciated that the mounting structure can take on many different forms. Referring now to FIG. 4, a schematic side view is shown of an LED lighting system 400 in accordance with various embodiments herein. The LED lighting system 400 can include a flexible layered circuit structure 402 and electrical leads 414 to provide electrical current to the flexible layered circuit structure 402. The flexible layered circuit structure 402 can be suspended above a housing substrate 408, such that there is an air gap 410 disposed in between the bottom thermally conductive layer of the flexible layered circuit structure 402 and the housing substrate 408. In some embodiments, the air gap 410 is present under at least about 80% of the surface area of the bottom of the flexible layered circuit structure 402. A mounting structure can be used to suspend the flexible layered circuit structure. In this embodiment, the mounting structure can include one or more posts 406 or standoffs. The posts 406 can serve to hold the flexible layered circuit structure 402 in place. In some embodiments, the posts can be configured to exert tension on the flexible layered circuit structure in the direction of the lengthwise axis of the flexible layered circuit structure such that it is maintained taut.

The air gap 410 can be of various sizes. In some embodiments, the air gap can be at least about 0.5 mm. In some embodiments, the air gap can be from between 0.5 mm and 100 mm. In some embodiments, the air gap can be from between 1 mm and 50 mm. In some embodiments, the air gap can be from between 2 mm and 25 mm. In some embodiments, the air gap can be between about 40% and 60% of the width of the flexible layered circuit structure.

The air gap can serve to promote heat dissipation off of the bottom layer of the flexible layered circuit structure. In particular, the LED lighting system can be configured so as to have thermal transfer properties sufficient to allow the system to maintain a thermal equilibrium at or below the critical junction temperatures for the LEDs without the need for the addition of secondary heat sinking. The critical junction temperatures can vary based on the specific LED model and manufacturer. However, critical junction temperatures can range from 100 degrees Celsius or less for some LED models to 150 degrees Celsius or more for others. In some embodiments, the junction temperature can be kept below 150 degrees Celsius. In some embodiments, the junction temperature can be kept below 140 degrees Celsius. In some embodiments, the junction temperature can be kept below 130 degrees Celsius. In some embodiments, the junction temperature can be kept below 120 degrees Celsius. In some embodiments, the junction temperature can be kept below 110 degrees Celsius. In some embodiments, the junction temperature can be kept below 100 degrees Celsius. In some embodiments, the junction temperature can be kept below 90 degrees Celsius.

In various embodiments, the mounting structure can include many different specific structural elements. By way of example, in some embodiments, the mounting structure can include a fastener, a hook, a pin, a clip, a spring clip, a tab and/or tab receptacle. In various embodiments, the mounting structure can be directly or indirectly attached to the housing substrate. In some embodiments, the flexible layered circuit structure can be attached to the mounting structure in a releasable manner. In some embodiments, the flexible layered circuit structure can be releasable form the mounting structure in such a way that specialized tools are not required and thus the flexible layered circuit structure can be released from the mounting structure by hand. In this manner, the flexible layered circuit structure can be configured for replacement. In some embodiments, the mounting structure can be used to align the flexible layered circuit structure with secondary optics or a diffuser.

The housing substrate can include many different materials. In some embodiments, the housing substrate can include organic or inorganic structural materials. In some embodiments, the housing substrate can be a material including, but not limited to, metals, polymers, cellulosic materials, composites, glass, stone and the like. In various embodiments, the housing substrate can be opaque, transparent, or semi-transparent.

Figure 5:
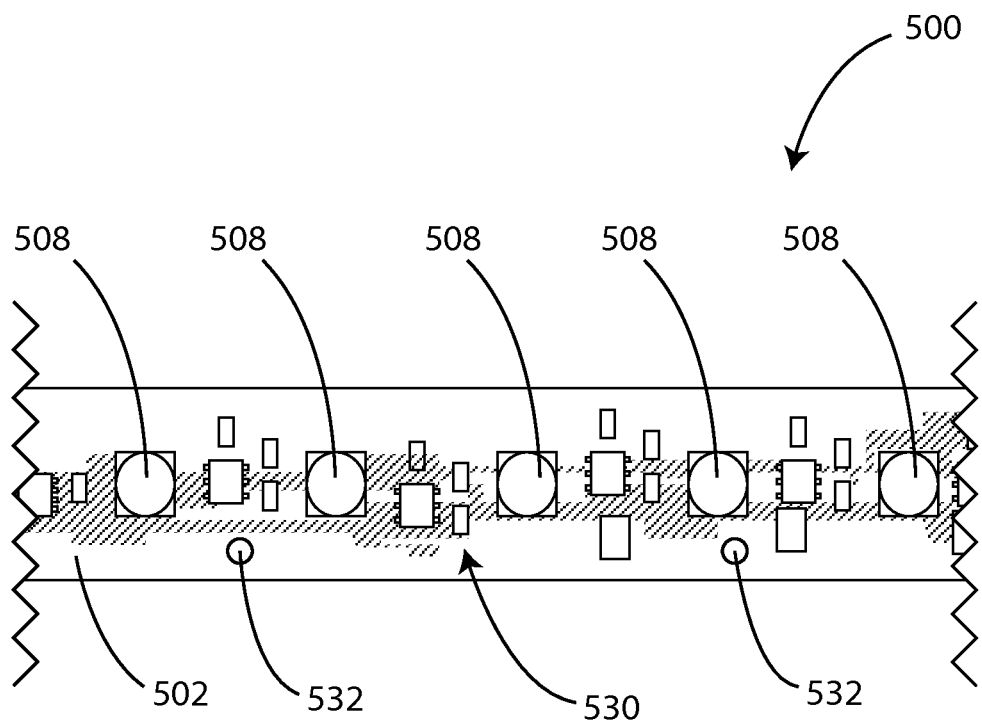
FIG. 5 is a schematic side view of an LED lighting system in accordance with various embodiments herein.

It will be appreciated that the mounting structure can be attached to the flexible layered circuit structure in many different ways. For example, in the context of posts, the posts can attach to the bottom, side, or ends of the flexible layered circuit structure. In some embodiments, the flexible layered circuit structure can include structural features so as to facilitate connection with the mounting structure. By way of example, in some embodiments the flexible layered circuit structure can define notches or apertures in order to facilitate connection with the mounting structure. Referring now to FIG. 5, a schematic top view is shown of a portion of an LED lighting system in accordance with various embodiments herein. The flexible layered circuit structure includes a top thermally conductive layer 502. A plurality of light emitting diodes 508 are mounted on the top thermally conductive layer 502. A variety of circuitry 530 can be etched into or disposed on the top thermally conductive layer 502. In addition, a plurality of apertures 532 are formed in the flexible layered circuit structure. These apertures 532 can be configured to engage a mounting structure, or a portion thereof.

Figure 6:
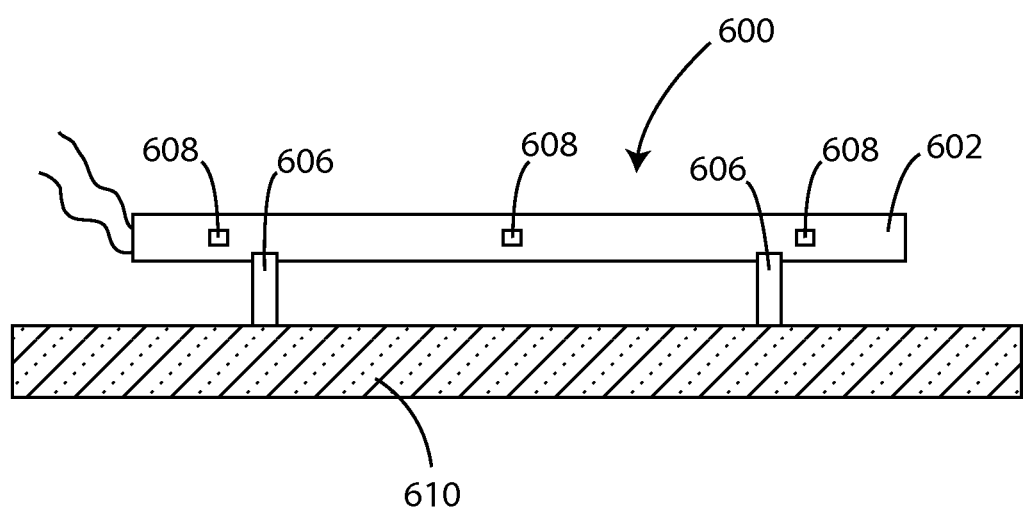
FIG. 6 is a schematic side view of an LED lighting system in accordance with various embodiments herein.

Referring now to FIG. 6, a schematic side view is shown of an LED lighting system 600 in accordance with various embodiments herein. In this embodiment, the flexible layered circuit structure 602 carrying the light emitting diodes 608 is oriented on its side (or lateral side or lateral edge) relative to posts 606, which can serve as a mounting structure to maintain an air gap in between the flexible layered circuit structure 602 and the housing substrate 610. As such, in this embodiment the mounting structure can engage a lateral side of the flexible layered circuit structure.

Figure 7:
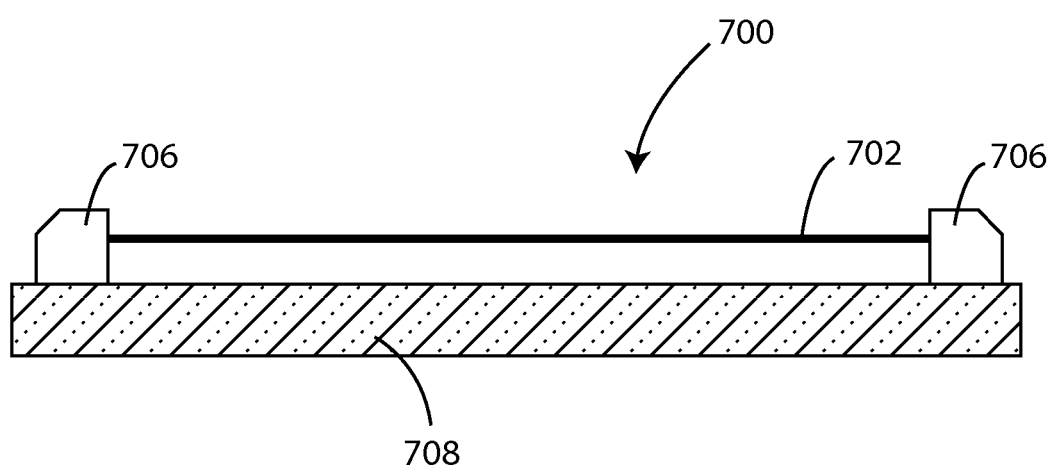
FIG. 7 is a schematic side view of an LED lighting system in accordance with various embodiments herein.

Referring now to FIG. 7, a schematic side view is shown of an LED lighting system 700 in accordance with various embodiments herein. In this view, the flexible layered circuit structure 702 is suspended above the housing substrate through mounting structure elements 706. In this case, the ends of the flexible layered circuit structure interface with the mounting structure elements 706, however, it will be appreciated that other portions of the flexible layered circuit structure 702 can interface with the mounting structure elements 706.

Figure 8:
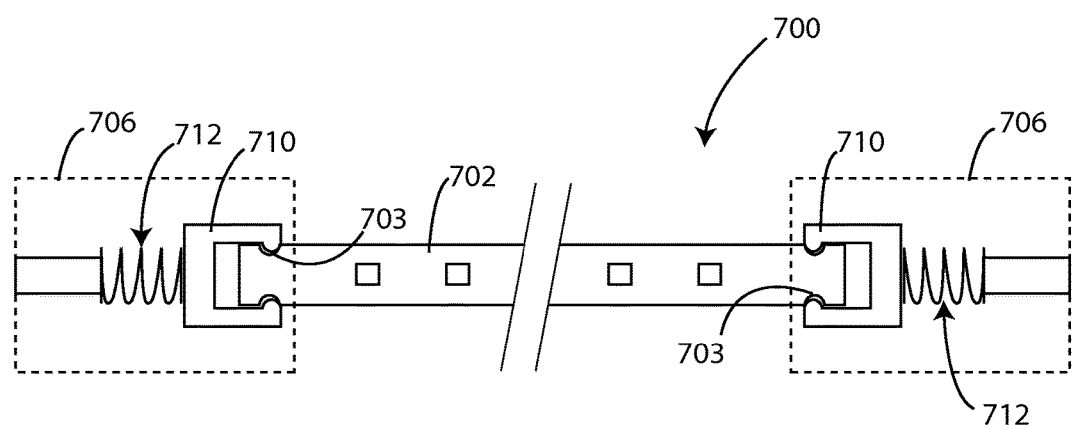
FIG. 8 is a schematic cut away top view of an LED lighting system in accordance with various embodiments herein.

Referring now to FIG. 8, a schematic cut away top view is shown of an LED lighting system 700 in accordance with various embodiments herein. In this view, one example of how the flexible layered circuit structure 702 can be attached to the mounting structure elements 706 is shown. The flexible layered circuit structure 702 can define notches 703 near the ends of the flexible layered circuit structure 702. The mounting structure elements 706 can include an engagement member 710 that passes into the notches 703 in order to grip the flexible layered circuit structure 702. The mounting structure elements 706 can also include a tensioner 712. The tensioner 712 can provide spring force in order to apply tension to the flexible layered circuit structure in order to make it taut. In some embodiments, the tensioner 712 can be configured to maintain a tension force of at least about one ounce (0.28 N). The tensioner 712 can be configured to maintain a tension force on the flexible layered circuit structure despite thermal expansion of the flexible layered circuit structure. By way of example, in some embodiments, the tensioner can be configured to maintain a tension force of at least one ounce (0.28 N) despite thermal expansion of the flexible layered circuit structure of up to 1 millimeter per meter in length of the flexible layered circuit structure. In some embodiments, the tensioner 712 can include a spring. In some embodiments, the mounting structure is used to take up variable length or mechanical tolerances in the construction of the flexible layered circuit structure.

Figures 9, 10:
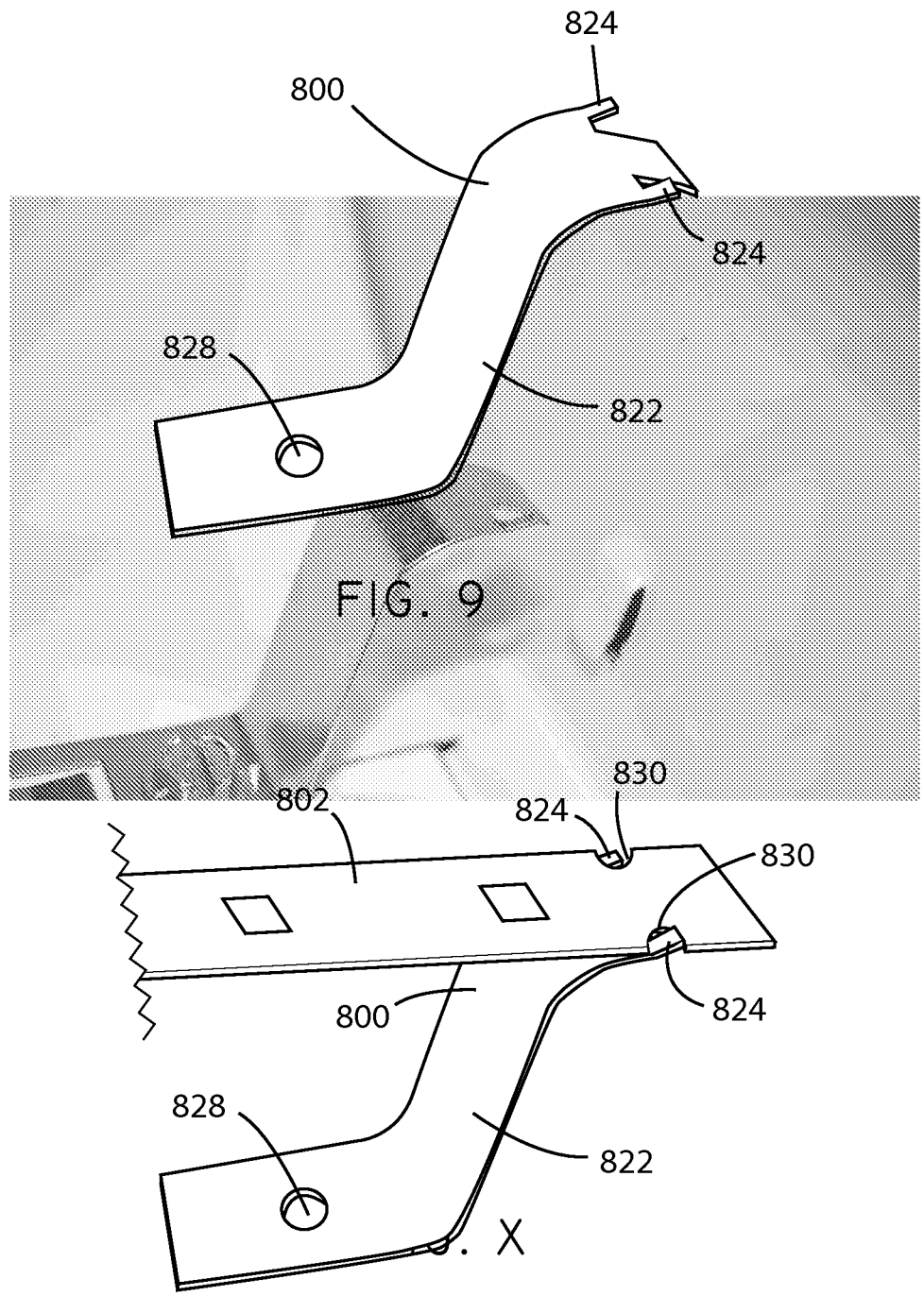
FIG. 9 is a schematic view of a portion of a mounting structure in accordance with various embodiments herein.
FIG. 10 is a schematic view of a portion of a mounting structure interfaced with a flexible layered circuit structure in accordance with various embodiments herein.

Referring now to FIG. 9, a schematic view of a portion of a mounting structure 800 is shown in accordance with various embodiments herein. The mounting structure 800 can include tabs 824 (or projections). The mounting structure 800 can include a body portion 822 and an aperture 828 to facilitate mounting to another component such as a housing substrate. Referring now to FIG. 10, a schematic view of a portion of a mounting structure 800 interfaced with a flexible layered circuit structure 802 is shown in accordance with various embodiments herein. In this view, it can be seen that the tabs 824 fit within the notches 830 in the flexible layered circuit structure to support it and hold it in place. In addition, the body portion 822 can be capable of being flexed to generate a spring force that can be exerted on the flexible layered circuit structure 802. In this embodiment, the mounting structure for a single end of the flexible layered circuit structure can be formed of a single piece of material, such as a metal or a polymer. However, in other embodiments the mounting structure can include multiple pieces of material.

Figure 11:
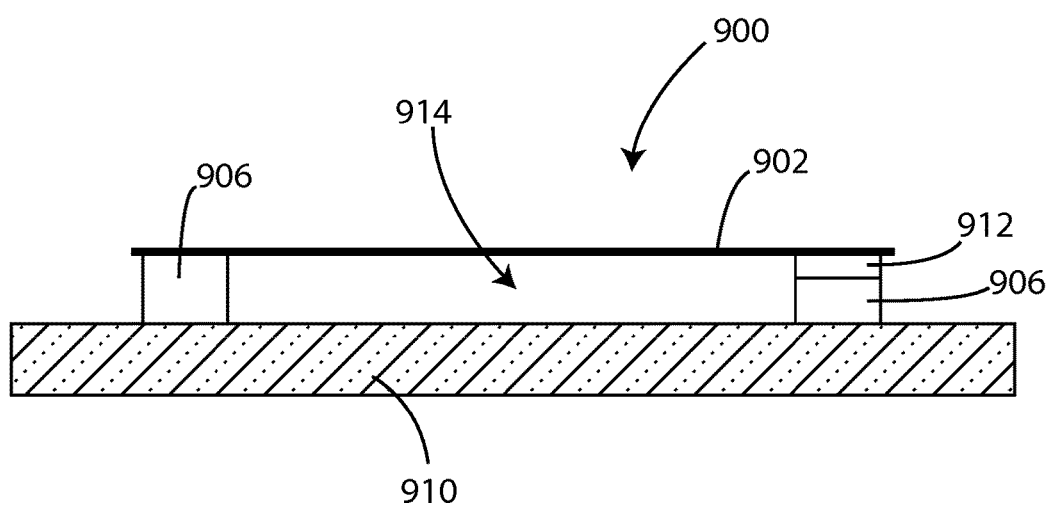
FIG. 11 is a schematic side view of an LED lighting system in accordance with various embodiments herein.

Referring now to FIG. 11, a schematic side view is shown of an LED lighting system 900 in accordance with various embodiments herein. The LED lighting system 900 can include a flexible layered circuit structure 902. The flexible layered circuit structure 902 can be suspended above a housing substrate 910, such that there is an air gap 914 disposed in between the bottom thermally conductive layer of the flexible layered circuit structure 902 and the housing substrate 910. A mounting structure can be used to suspend the flexible layered circuit structure. In this embodiment, the mounting structure can include one or more blocks 906. The blocks 906 can serve to hold the flexible layered circuit structure 902 in place. In some embodiments, the posts can be configured to exert tension on the flexible layered circuit structure in the direction of the lengthwise axis of the flexible layered circuit structure such that it is maintained taut (e.g., the tension is exerted in a direction away from the middle of the flexible layered circuit structure). In some embodiments, a tensioner 912 can be disposed between the block 906 and the flexible layered circuit structure 902. In this embodiment, for example, the tensioner 912 can include a spring-loaded connection point (such as a hook or tab receptacle) to exert tension on the flexible layered circuit structure 902. In some embodiments, the tensioner 912 can be configured to move with respect to the block 906 in order to apply tension to the flexible layered circuit structure 902. By way of example, the block 906 can move within a channel formed in the block 906.

Figure 12:
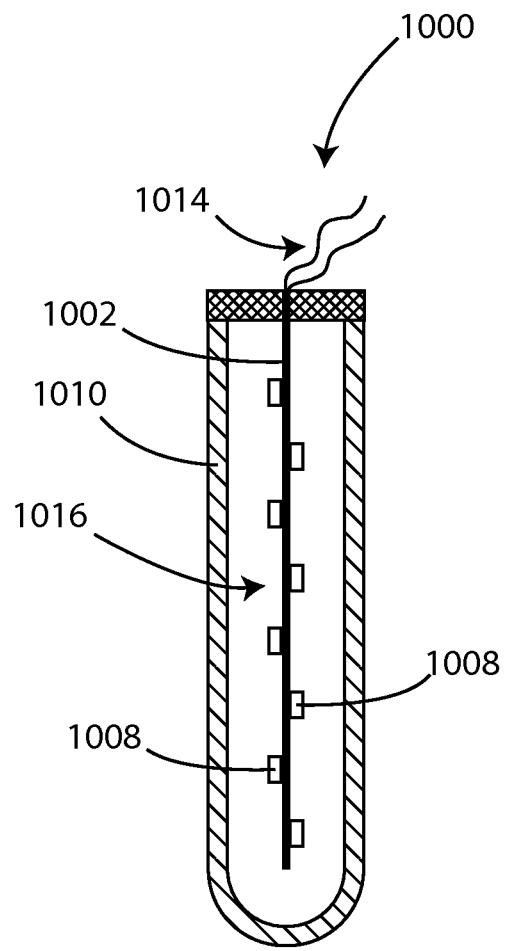
FIG. 12 is a schematic side view of an LED lighting system in accordance with various embodiments herein.

Referring now to FIG. 12, a schematic side view is shown of an LED lighting system 1000 in accordance with various embodiments herein. The LED lighting system 1000 can include a flexible layered circuit structure 1002. Light emitting diodes 1008 can be mounted on the flexible layered circuit structure 1002. The flexible layered circuit structure 1002 can be suspended inside a cavity defined by a housing substrate 1010. There can be an air gap 1016 disposed in between the flexible layered circuit structure 1002 and the housing substrate 1010. Leads 1014 can be arranged to provide electrical current to the flexible layered circuit structure 1002.

Figure 13:
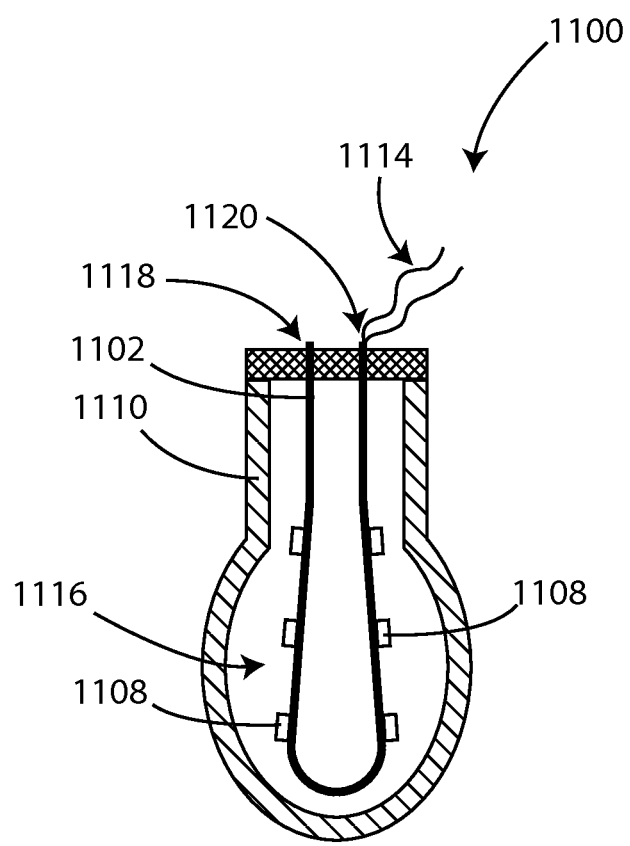
FIG. 13 is a schematic side view of an LED lighting system in accordance with various embodiments herein.

Referring now to FIG. 13, a schematic side view is shown of an LED lighting system 1100 in accordance with various embodiments herein. The LED lighting system 1100 can include a flexible layered circuit structure 1102. Light emitting diodes 1108 can be mounted on the flexible layered circuit structure 1102. In this embodiment, the flexible layered circuit structure 1102 can assume a U shape such that the first end 1118 and the second end 1120 are disposed adjacent to one another. The flexible layered circuit structure 1102 can be suspended inside a cavity defined by a housing substrate 1110. There can be an air gap 1116 disposed in between the flexible layered circuit structure 1102 and the housing substrate 1110. Leads 1114 can be arranged to provide electrical current to the flexible layered circuit structure 1102.

Figure 14:
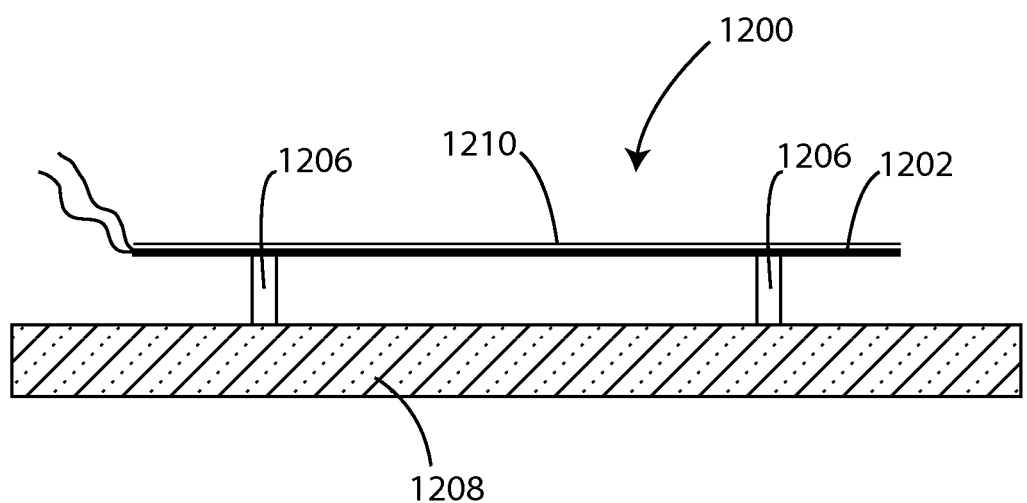
FIG. 14 is a schematic side view of an LED lighting system in accordance with various embodiments herein.

Referring now to FIG. 14, a schematic side view is shown of an LED lighting system 1200 in accordance with various embodiments herein. The LED lighting system 1200 can include a flexible layered circuit structure 1202 and electrical leads to provide electrical current to the flexible layered circuit structure 1202. Material can be disposed over the top of flexible layered circuit structure 1202 (and thus over the top of LEDs in various embodiments) such as optics 1210, secondary optics, or a diffuser. The flexible layered circuit structure 1202 can be suspended above a housing substrate 1208, such that there is an air gap disposed in between the bottom thermally conductive layer of the flexible layered circuit structure 1202 and the housing substrate 1208. A mounting structure can be used to suspend the flexible layered circuit structure. In this embodiment, the mounting structure can include one or more posts 1206 or standoffs.

Figure 15:
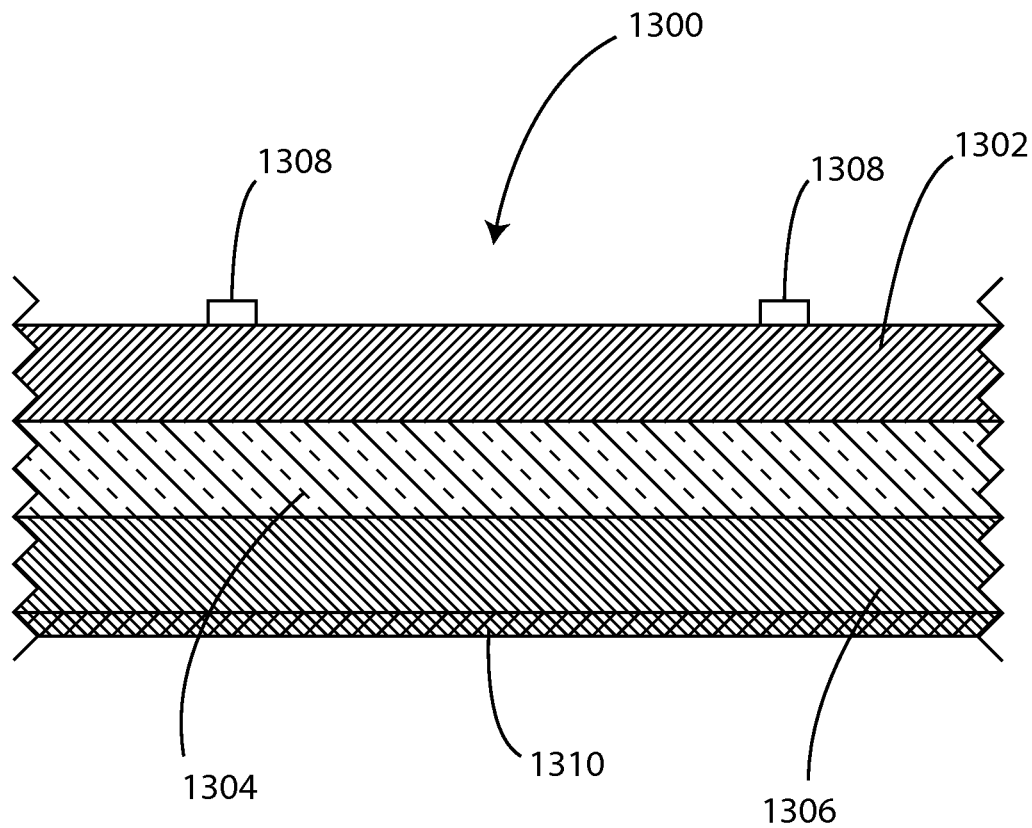
FIG. 15 is a schematic cross sectional view of a flexible layered circuit structure in accordance with various embodiments herein.

It will be appreciated that various modifications can be made in order to enhance heat dissipation in the system. By way of example, various modifications can be made to the flexible layered circuit structure in order to enhance heat dissipation. Referring now to FIG. 15, a schematic cross sectional view is shown of a flexible layered circuit structure 1300 in accordance with various embodiments herein. The flexible layered circuit structure can include a top thermally conductive layer 1302, a middle electrically insulating layer 1304, and a bottom thermally conductive layer 1306. A plurality of light emitting diodes 1308 can be mounted on the top thermally conductive layer 1302. A coating 1310 can be disposed on the bottom thermally conductive layer 1306, the coating 1310 comprising a material with properties that enhance heat transfer. For example, in some embodiments, the coating can be a thermally conductive and emissive material. In some embodiments, the coating can be a material such as tinning.

In some embodiments, additional structural features can be disposed on the bottom layer in order to assist in heat dissipation. By way of example, structural features including, but not limited to, heat slugs, cooling fins, heat conductive projections, and the like can be mounted on the bottom surface of the bottom layer in order to aid in heat dissipation.

Figure 16:
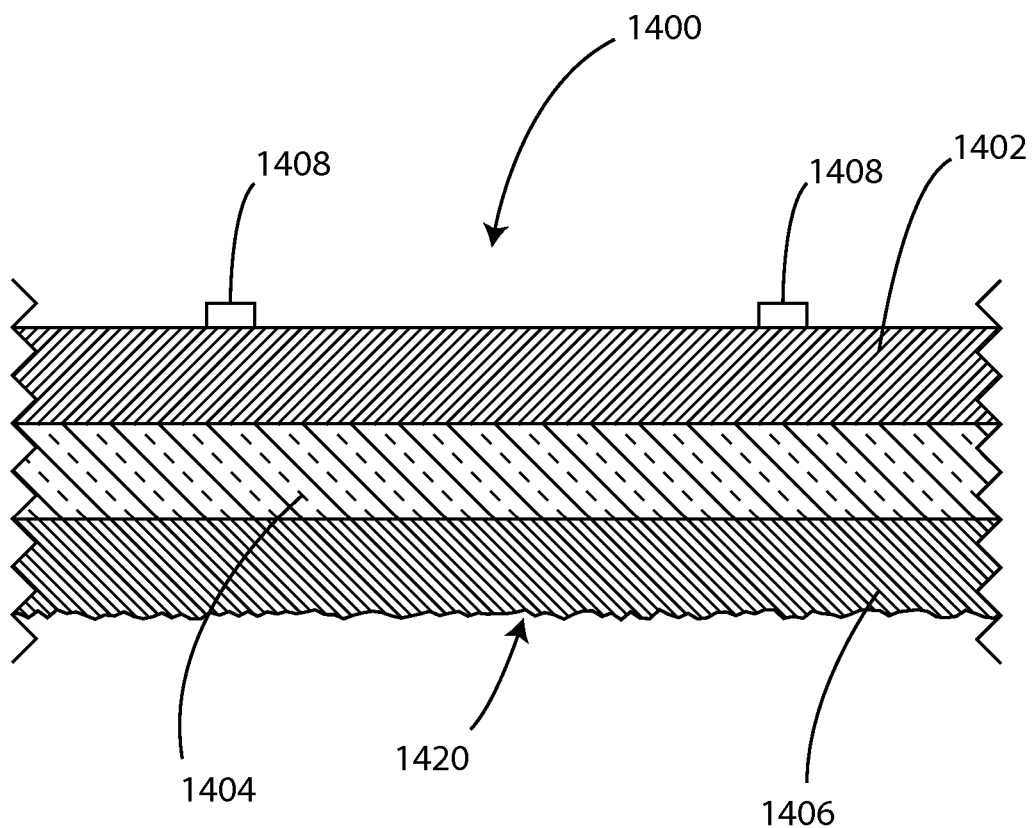
FIG. 16 is a schematic cross sectional view of a flexible layered circuit structure in accordance with various embodiments herein.

In some embodiments, the flexible layered circuit structure can be altered in order to enhance heat transfer. Referring now to FIG. 16, a schematic cross sectional view is shown of a flexible layered circuit structure 1400 in accordance with various embodiments herein in accordance with various embodiments herein. The flexible layered circuit structure can include a top thermally conductive layer 1402, a middle electrically insulating layer 1404, and a bottom thermally conductive layer 1406. A plurality of light emitting diodes 1408 can be mounted on the top thermally conductive layer 1402. In this embodiment, the bottom surface 1420 of the bottom thermally conductive layer 1406 can have a surface topology that is different than a standard flat surface. By way of example, the surface can have numerous peaks and valleys (or be textured) in order to increase the surface area.

In some embodiments, the textured surface can have a surface area at least 10 percent greater than an equally sized substantially flat surface. In some embodiments, the textured surface can have a surface area at least 20 percent greater than an equally sized substantially flat surface. In some embodiments, the textured surface can have a surface area at least 30 percent greater than an equally sized substantially flat surface. In some embodiments, the textured surface can have a surface area at least 40 percent greater than an equally sized substantially flat surface. In some embodiments, the textured surface can have a surface area at least 80 percent greater than an equally sized substantially flat surface. In some embodiments, the textured surface can have a surface area at least 100 percent greater than an equally sized substantially flat surface.

Figure 17:
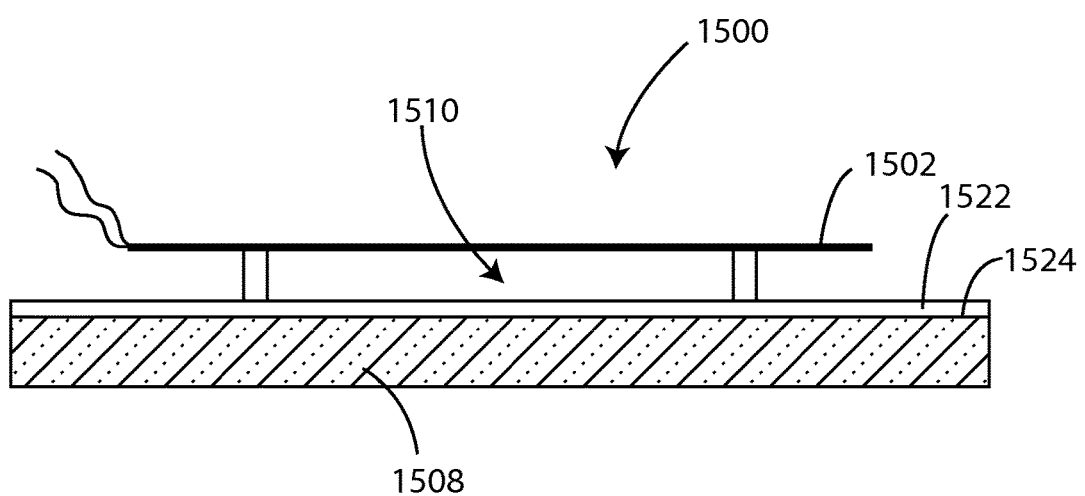
FIG. 17 is a schematic side view of an LED lighting system in accordance with various embodiments herein.

Referring now to FIG. 17, a schematic side view is shown of an LED lighting system 1500 in accordance with various embodiments herein. The LED lighting system 1500 can include a flexible layered circuit structure 1502 and electrical leads to provide electrical current to the flexible layered circuit structure 1502. The flexible layered circuit structure 1502 can be suspended above a housing substrate 1508, such that there is an air gap 1510. The top surface 1524 of the housing substrate 1508 can be coated with a layer of material 1522 to enhance heat flow across the air gap 1510.

In some embodiments, a fan can be included to enhance heat dissipation by causing movement of air over surfaces of the flexible layered circuit structure.

It will be appreciated that various methods are also included herein. The method for making an LED lighting system can include obtaining a flexible layered circuit structure that can include, a top thermally conductive layer, a middle electrically insulating layer, a bottom thermally conductive layer. The method can further include suspending the flexible layered circuit structure above a housing substrate with an air gap disposed in between the bottom thermally conductive layer of the flexible layered circuit structure and the housing substrate, wherein the distance between the layered circuit structure and the housing substrate is at least about 0.5 mm, and connecting the flexible layered circuit structure to a power source.

In some embodiments, suspending includes attaching the flexible layered circuit structure to a mounting structure. In some embodiments, the mounting structure provides the connection to the power source. In some embodiments, the method can further include cutting the flexible layered circuit structure to a desired length. In some embodiments, the method can include unwinding the flexible layered circuit structure from a storage reel prior to cutting. In some embodiments, suspending can include attaching the flexible layered circuit structure to a mounting structure that provides a tension force along the length of the flexible layered circuit structure. In some embodiments, the method can further include applying a tension force of at least one ounce (0.28 N) to the flexible layered circuit structure. In some embodiments, the method can further include removing the flexible layered circuit structure from the position suspended above a housing substrate. In some embodiments, the action of removing the flexible layered circuit structure can be accomplished without tools. In some embodiments, the method can further include replacing the flexible layered circuit structure with another flexible layered circuit structure.

Figure 18:
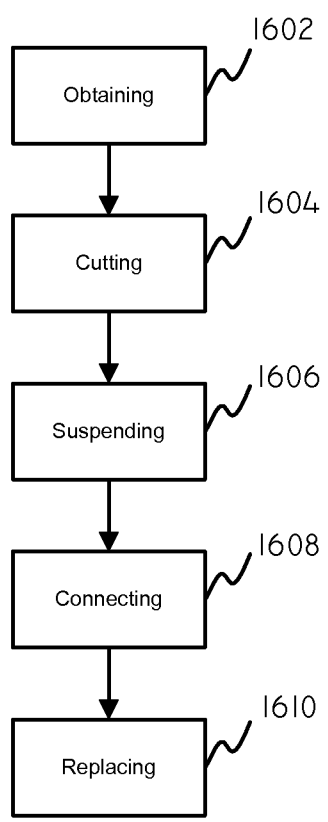
FIG. 18 is a flowchart of a method of making an LED lighting system in accordance with various embodiments herein.

Referring now to FIG. 18, a flow chart is shown of a method of making an LED lighting system in accordance with various embodiments herein. The method can include an operation of obtaining a flexible layered circuit structure 1602. Optionally, in some embodiments, the method can further include an operation of cutting the flexible layered circuit structure to a desired length 1604. In various embodiments, the method can further include an operation of suspending the flexible layered circuit structure above a housing substrate 1606. In some embodiments, the method can further include an operation of connecting the flexible layered circuit structure to a power source 1608. Optionally, in some embodiments, the method can include a step of replacing the flexible layered circuit structure with another flexible layered circuit structure 1610. In various embodiments the flexible layer circuit structure can be removed, and optionally replaced, without the use of tools (for example without the need to remove soldering from elements of the system).

In some embodiments, a method for operating an LED lighting system is included. The method for operating an LED lighting system can include providing electrical current to an LED lighting circuit, the LED lighting circuit including a plurality of light emitting diodes, the LED lighting circuit disposed upon a flexible layered circuit structure can include a top thermally conductive layer, a middle electrically insulating layer, and a bottom thermally conductive layer. The method can further include dissipating heat from the light emitting diodes to ambient air through the top surface of the top thermally conductive layer and the bottom surface of the bottom thermally conductive layer.

It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration to. The phrase "configured" can be used interchangeably with other similar phrases such as arranged and configured, constructed and arranged, constructed, manufactured and arranged, and the like.

All publications and patent applications in this specification are indicative of the level of ordinary skill in the art to which this invention pertains. All publications and patent applications are herein incorporated by reference to the same extent as if each individual publication or patent application was specifically and individually indicated by reference.

The invention has been described with reference to various specific and preferred embodiments and techniques. However, it should be understood that many variations and modifications may be made while remaining within the spirit and scope of the invention.

Further Embodiments

In some embodiments, an LED lighting system is included. The LED lighting system can include a flexible layered circuit structure including a top thermally conductive layer, a middle electrically insulating layer, a bottom thermally conductive layer, and a plurality of light emitting diodes mounted on the top layer. The system can further include a housing substrate and a mounting structure. The mounting structure can be configured to suspend the layered circuit structure above the housing substrate with an air gap disposed in between bottom thermally conductive layer of the flexible layered circuit structure and the housing substrate. The distance between the layered circuit structure and the support layer can be at least about 0.5 mm. The system can further include a plurality of light emitting diodes mounted on the bottom layer. The system can further include an optically translucent material layer disposed over the top thermally conductive layer. The distance between the layered circuit structure and the support layer can be between about 0.5 mm and 100 mm. The distance between the layered circuit structure and the support layer can be between about 40% and 60% of the width of the flexible layered circuit structure. The mounting structure can include a tensioner to apply tension to the flexible layered circuit structure. The tensioner can provide a spring force applied to the flexible layered circuit structure. The tensioner can include a spring. The tensioner can be configured to maintain a tension force of at least one ounce (0.28 N). The tensioner can be configured to maintain a tension force of at least one ounce (0.28 N) despite thermal expansion of the flexible layered circuit structure of up to 1 millimeter per meter in length of the flexible circuit structure. The mounting structure can include a fastener. The mounting structure can include a hook. The mounting structure can include a pin. The mounting structure can include a clip. The mounting structure can include a spring clip. The mounting structure can include a tab or tab receptacle. The mounting structure can be direct or indirectly attached to the housing substrate. The flexible layered circuit structure can include a first end and a second end, wherein the mounting structure engages the first end and the second end. The flexible layered circuit structure can be in a U shape such that the first end and the second end are disposed adjacent to one another. The flexible layered circuit structure can have a first lateral side and a second lateral side, wherein the mounting structure can engage at least one of the first lateral side and the second lateral side. The housing substrate can include a material that can be selected from the group consisting of organic and inorganic structural materials. The housing substrate can include a material that can be selected from the group consisting of a polymer, a cellulosic material, a composite, a glass, and stone. The housing substrate can include a metal. The light emitting diodes mounted on the top layer can have a power of between 0.25 and 3 watts per inch squared of the surface area of the bottom layer. The flexible circuit structure can have sufficient flexibility to achieve bending with a radius of curvature of at least 1 inch. The flexible layered circuit structure can define apertures, the mounting structure can be configured to engage the apertures to support the flexible layered circuit structure. The bottom thermally conductive layer can include a textured surface having a surface area greater than an equally sized substantially flat surface. The bottom thermally conductive layer can include a plurality of heat sink fins mounted thereon. The bottom thermally conductive layer can include a textured surface having a surface area at least 20 percent greater than an equally sized substantially flat surface. The system can further include a coating over the bottom thermally conductive layer, the coating can include a material with properties that enhance heat transfer. The coating can include tinning. The bottom layer can be covered with a thermally conductive and emissive material. The housing substrate can be coated with a material to enhance heat flow across the air gap. The top layer can include 0.5 to 4.0 ounces per square foot of copper, the intermediate layer can include fiberglass 0.005 to 0.020 inches thick, and the bottom layer can include 0.5 to 4.0 ounces per square foot of copper. The top, intermediate, and bottom layers, together, can have a thermal resistance of less than 10 degrees Celsius per Watt. The system can be configured to have thermal transfer properties sufficient to allow the system to maintain a thermal equilibrium at or below the critical junction temperatures for the LEDs without the addition of secondary heat sinking. The flexible layered circuit structure is attached to the mounting structure in a releasable manner. The flexible layered circuit structure can be releasable from the mounting structure without the use of tools. The flexible layered circuit structure can be configured for replacement.

In some embodiments, an LED lighting system is included. The LED lighting system can include a flexible layered circuit structure including a top thermally conductive layer, a middle electrically insulating layer, a bottom thermally conductive layer, a plurality of light emitting diodes mounted on the bottom layer, a housing substrate, and a mounting structure. The mounting structure can be configured to suspend the layered circuit structure above the housing substrate with an air gap disposed in between bottom thermally conductive layer of the flexible layered circuit structure and the housing substrate, wherein the distance between the layered circuit structure and the support layer is at least about 0.5 mm.

In some embodiments, a method for making an LED lighting system is included. The method for making an LED lighting system can include obtaining a flexible layered circuit structure that includes, a top thermally conductive layer, a middle electrically insulating layer, a bottom thermally conductive layer. The method can also include suspending the flexible layered circuit structure above a housing substrate with an air gap disposed in between the bottom thermally conductive layer of the flexible layered circuit structure and the housing substrate, wherein the distance between the layered circuit structure and the housing substrate is at least about 0.5 mm, and connecting the flexible layered circuit structure to a power source. Suspending can include attaching the flexible layered circuit structure to a mounting structure. The mounting structure can provide the connection to the power source. The method can further include cutting the flexible layered circuit structure to a desired length. The method can further include unwinding the flexible layered circuit structure from a storage reel prior to cutting. Suspending can include attaching the flexible layered circuit structure to a mounting structure that provides a tension force along the length of the flexible layered circuit structure. The method can further include applying a tension force of at least one ounce (0.28 N) to the flexible layered circuit structure. The method can further include removing the flexible layered circuit structure from the position suspended above a housing substrate. The step of removing can be accomplished without tools. The method can further include replacing the flexible layered circuit structure with another flexible layered circuit structure.

In some embodiments, a method for operating an LED lighting system is included. The method for operating an LED lighting system can include providing electrical current to an LED lighting circuit, the LED lighting circuit including a plurality of light emitting diodes, the LED lighting circuit disposed upon a flexible layered circuit structure. The flexible layered circuit structure can include a top thermally conductive layer, a middle electrically insulating layer, and a bottom thermally conductive layer. The method can further include dissipating heat from the light emitting diodes to ambient air through the top surface of the top thermally conductive layer and the bottom surface of the bottom thermally conductive layer.

In some embodiments, an LED lighting system is included. The LED lighting system can include a flexible layered circuit structure including a top thermally conductive layer, a middle electrically insulating layer, a bottom thermally conductive layer, and a plurality of light emitting diodes mounted on the top layer. The flexible layered circuit structure can be formed into a loop. The loop can be disposed within a housing. The loop can be separated from the housing by an air gap. The loop can be disposed sideways to the support structure.

The invention claimed is:

1. An LED lighting system comprising:
a flexible layered circuit structure comprising
a top thermally conductive layer;
a middle electrically insulating layer;
a bottom thermally conductive layer;
a plurality of light emitting diodes mounted on the top layer;
a housing substrate;
a mounting structure, the mounting structure comprising an engagement member that grips the flexible layered circuit structure, the mounting structure suspending the layered circuit structure above the housing substrate such that an air gap is disposed in between the bottom thermally conductive layer of the flexible layered circuit structure and the housing substrate, the air gap having a long dimension and a short dimension approximately orthogonal to the long dimension such that the long dimension is longer than the short dimension, where the air gap is open to at least one side of the long dimension of the flexible layered circuit structure, and wherein the distance between the layered circuit structure and the housing substrate is at least about 0.5 mm; and
wherein the mounting structure exerts tension outward on the flexible layered circuit structure along the lengthwise axis of the flexible layered circuit structure away from a middle of the flexible layered circuit structure.

2. The LED lighting system of claim 1, further comprising a plurality of light emitting diodes mounted on the bottom layer.

3. The LED lighting system of claim 1, further comprising an optically translucent material layer disposed over the top thermally conductive layer.

4. The LED lighting system of claim 1, wherein the distance between the layered circuit structure and the housing substrate is between about 0.5 mm and 100 mm.

5. The LED lighting system of claim 1, wherein the distance between the layered circuit structure and the housing substrate is between about 40% and 60% of the width of the flexible layered circuit structure.

6. The LED lighting system of claim 1, the mounting structure comprising a tensioner to apply tension to the flexible layered circuit structure.

7. The LED lighting system of claim 6, the tensioner providing a spring force applied to the flexible layered circuit structure.

8. The LED lighting system of claim 7, wherein the tensioner comprises a first spring and a second spring.

9. The LED lighting system of claim 6, the tensioner configured to maintain a tension force of at least one ounce (0.28 N).

10. The LED lighting system of claim 6, the tensioner configured to maintain a tension force of at least one ounce (0.28 N) despite thermal expansion of the flexible layered circuit structure of up to 1 millimeter per meter in length of the flexible circuit structure.

11. The LED lighting system of claim 1, the mounting structure comprising an item selected from the group consisting of a fastener, a hook, a pin, a clip, a spring clip, a tab, and a tab receptacle.

12. The LED lighting system of claim 1, wherein the flexible layered circuit structure has a first end and a second end, wherein the mounting structure engages the first end and the second end.

13. The LED lighting system of claim 12, wherein the flexible layered circuit structure comprises a U shape such that the first end and the second end are disposed adjacent to one another.

14. The LED lighting system of claim 1, wherein the flexible layered circuit structure has a first lateral side and a second lateral side, wherein the mounting structure engages at least one of the first lateral side and the second lateral side.

15. The LED lighting system of claim 1, the housing substrate comprising a material selected from the group consisting of organic and inorganic structural materials.

16. The LED lighting system of claim 1, wherein the light emitting diodes mounted on the top layer have a power of between 0.25 and 3 watts per inch squared of the surface area of the bottom layer.

17. The LED lighting system of claim 1, wherein the flexible circuit structure sufficient flexibility to achieve bending with a radius of curvature of at least 1 inch.

18. The LED lighting system of claim 1, the flexible layered circuit structure defining apertures, the mounting structure configured to engage the apertures to support the flexible layered circuit structure.

19. The LED lighting system of claim 1, the bottom thermally conductive layer comprising a textured surface having a surface area greater than an equally sized substantially flat surface.

20. The LED lighting system of claim 1, the bottom layer covered with a thermally conductive and emissive material.

21. The LED lighting system of claim 1, the housing substrate coated with a material to enhance heat flow across the air gap.

22. The LED lighting system of claim 1, wherein the top layer includes 0.5 to 4.0 ounces per square foot of copper, the intermediate layer includes fiberglass 0.005 to 0.020 inches thick, and the bottom layer includes 0.5 to 4.0 ounces per square foot of copper.

23. The LED lighting system of claim 1, wherein the top, intermediate, and bottom layers have a thermal resistance of less than 10 degrees Celsius per Watt.

24. The LED lighting system of claim 1, configured to have thermal transfer properties sufficient to allow the system to maintain a thermal equilibrium at or below the critical junction temperatures for the LEDs without the addition of secondary heat sinking.

25. The LED lighting system of claim 1, wherein the flexible layered circuit structure is attached to the mounting structure in a releasable manner.

26. The LED lighting system of claim 1, wherein the flexible layered circuit structure is configured for replacement.

27. The LED lighting system of claim 1, wherein the mounting structure supports the layered circuit structure such that the top surface of the layered circuit structure and the bottom surface of the layered circuit structure are substantially open to surrounding air.

28. An LED lighting system comprising:
a flexible layered circuit structure comprising
a top thermally conductive layer;
a middle electrically insulating layer;
a bottom thermally conductive layer;
a plurality of light emitting diodes mounted on the bottom layer;

a housing substrate;

a mounting structure suspending the layered circuit structure above the housing substrate by connecting to a top layer of the housing substrate and a bottom layer of the flexible layered circuit structure, where the mounting structure supports the layered circuit structure such that the top surface of the layered circuit structure and the bottom surface of the layered circuit structure are substantially open to surrounding air, and where the top layer of the housing substrate and a bottom layer of the flexible layered circuit structure approximately face one another, with an air gap disposed in between bottom thermally conductive layer of the flexible layered circuit structure and the housing substrate, wherein the distance between the layered circuit structure and the housing substrate is at least about 0.5 mm; and wherein the mounting structure exerts tension on the flexible layered circuit structure in a direction away from the middle of the flexible layered circuit structure along the lengthwise axis of the flexible layered circuit structure such that it is maintained taut.

* * * * *